(12) United States Patent
Humphrey et al.

(10) Patent No.: US 11,318,550 B2
(45) Date of Patent: May 3, 2022

(54) SYSTEM AND METHOD FOR CLEANING WIRE BONDING MACHINES USING FUNCTIONALIZED SURFACE MICROFEATURES

(71) Applicant: INTERNATIONAL TEST SOLUTIONS, INC., Reno, NV (US)

(72) Inventors: Alan E. Humphrey, Reno, NV (US); Jerry J. Broz, Longmont, CO (US); Bret A. Humphrey, Reno, NV (US); Alex S. Poles, Reno, NV (US); Wayne C. Smith, Reno, NV (US); Janakraj Shivlal, Singapore (SG)

(73) Assignee: International Test Solutions, LLC, Reno, NV (US)

( * ) Notice: Subject to any disclaimer, the term of this patent is extended or adjusted under 35 U.S.C. 154(b) by 0 days.

(21) Appl. No.: 16/855,841

(22) Filed: Apr. 22, 2020

(65) Prior Publication Data
US 2021/0146464 A1 May 20, 2021

Related U.S. Application Data

(63) Continuation-in-part of application No. 16/684,453, filed on Nov. 14, 2019.

(51) Int. Cl.
| | |
|---|---|
| *B23K 3/08* | (2006.01) |
| *B23K 3/06* | (2006.01) |
| *B08B 1/00* | (2006.01) |

(52) U.S. Cl.
CPC .............. *B23K 3/08* (2013.01); *B23K 3/063* (2013.01); *B08B 1/001* (2013.01)

(58) Field of Classification Search
None
See application file for complete search history.

(56) References Cited

U.S. PATENT DOCUMENTS

| | | | |
|---|---|---|---|
| 2,971,208 A | 2/1961 | Moore et al. | |
| 3,453,677 A | 7/1969 | Cutler | |

(Continued)

FOREIGN PATENT DOCUMENTS

| | | | |
|---|---|---|---|
| CN | 1643065 A | 7/2005 | |
| CN | 1669677 A | 9/2005 | |

(Continued)

OTHER PUBLICATIONS

International Test Solutions, Probe Clean™ on Silicon Wafer Publication, dated May 2002, 2 pages.

(Continued)

*Primary Examiner* — Eric W Golightly
*Assistant Examiner* — Arlyn I Rivera-Cordero
(74) *Attorney, Agent, or Firm* — Thomas Omholt; Erika R. Singleton

(57) ABSTRACT

A cleaning material, device, and method for predictably cleaning the capillary tube for a wire bonding machine in which the cleaning pad has a predetermined configuration appropriate for the particular wire bonding machine and a substrate having a defined functionalized surface topology and geometry which can be introduced into the wire bonding machine during the normal wire bonding operations. The cleaning material has a predetermined topography with a plurality of functional 3-dimensional (3D) microstructures that provide performance characteristics which are not possible with a non-functionalized and flat surface.

6 Claims, 17 Drawing Sheets

(56) References Cited

U.S. PATENT DOCUMENTS

| | | |
|---|---|---|
| 3,644,953 A | 2/1972 | Christiansen |
| 3,675,265 A | 7/1972 | Landen et al. |
| 3,717,897 A | 2/1973 | Strickland |
| 3,945,079 A | 3/1976 | Westberg |
| 4,104,755 A | 8/1978 | Smith |
| 4,277,160 A | 7/1981 | Yamada |
| 4,334,780 A | 6/1982 | Pernick |
| 4,590,422 A | 5/1986 | Milligan |
| 4,832,772 A | 5/1989 | Noguchi et al. |
| 5,011,513 A | 4/1991 | Zador et al. |
| 5,192,455 A | 3/1993 | Marcel |
| 5,205,460 A | 4/1993 | Sato et al. |
| 5,220,279 A | 6/1993 | Nagasawa |
| 5,444,265 A | 8/1995 | Hamilton |
| 5,485,949 A | 1/1996 | Tomura et al. |
| 5,507,874 A | 4/1996 | Su et al. |
| 5,597,346 A | 1/1997 | Hempel, Jr. |
| 5,652,428 A | 7/1997 | Nishioka et al. |
| 5,671,119 A | 9/1997 | Huang et al. |
| 5,685,043 A | 11/1997 | LaManna et al. |
| 5,690,749 A | 11/1997 | Lee |
| 5,699,584 A | 12/1997 | Wieloch et al. |
| 5,746,928 A | 5/1998 | Yen et al. |
| 5,766,061 A | 6/1998 | Bowers |
| 5,778,485 A | 7/1998 | Sano et al. |
| 5,783,018 A | 7/1998 | Gore et al. |
| 5,814,158 A | 9/1998 | Hollander et al. |
| 5,930,857 A | 8/1999 | Ramos et al. |
| 5,946,184 A | 8/1999 | Kanno et al. |
| 5,968,282 A | 10/1999 | Yamasaka |
| 6,019,663 A | 2/2000 | Angell et al. |
| 6,030,674 A | 2/2000 | Onishi et al. |
| 6,056,627 A | 5/2000 | Mizuta |
| 6,118,290 A | 9/2000 | Sugiyama et al. |
| 6,121,058 A | 9/2000 | Shell et al. |
| 6,130,104 A | 10/2000 | Yamasaka |
| 6,170,116 B1 | 1/2001 | Mizuta |
| 6,183,677 B1 | 2/2001 | Usui et al. |
| 6,193,587 B1 | 2/2001 | Lin et al. |
| 6,224,470 B1 | 5/2001 | Hoey et al. |
| 6,256,555 B1 | 7/2001 | Bacchi et al. |
| 6,280,298 B1 | 8/2001 | Gonzales |
| 6,306,187 B1 | 10/2001 | Maeda et al. |
| 6,322,433 B1 | 11/2001 | Matsumura |
| 6,326,413 B1 | 12/2001 | Blackwell et al. |
| 6,355,495 B1 | 3/2002 | Fujino et al. |
| 6,366,112 B1 | 4/2002 | Doherty et al. |
| 6,474,350 B1 | 11/2002 | Mizuta |
| 6,507,393 B2 | 1/2003 | Batchelder |
| 6,523,208 B1 | 2/2003 | Muscato et al. |
| 6,646,455 B2 | 11/2003 | Maekawa et al. |
| 6,733,876 B1 | 5/2004 | Beardsley et al. |
| 6,741,086 B2 | 5/2004 | Maekawa et al. |
| 6,776,171 B2 | 8/2004 | Carpenter et al. |
| 6,777,966 B1 | 8/2004 | Humphrey et al. |
| 6,813,828 B2 | 11/2004 | Dlugokecki et al. |
| 6,817,052 B2 | 11/2004 | Grube |
| 6,821,620 B2 | 11/2004 | Namikawa et al. |
| 6,840,374 B2 | 1/2005 | Khandros et al. |
| 6,884,300 B2 | 4/2005 | Sato et al. |
| 6,888,344 B2 | 5/2005 | Maekawa et al. |
| 6,960,123 B2 | 11/2005 | Mitarai |
| 7,202,683 B2 | 4/2007 | Humphrey et al. |
| 7,254,861 B2 | 8/2007 | Morioka et al. |
| 7,306,849 B2 | 12/2007 | Buckholtz et al. |
| 7,530,887 B2 | 5/2009 | Jiang et al. |
| 7,575,790 B2 | 8/2009 | Terada et al. |
| 7,621,436 B2 | 11/2009 | Mii |
| 7,655,316 B2 | 2/2010 | Parkhe |
| 7,779,527 B2 | 8/2010 | Yudovsky et al. |
| 7,866,530 B1 | 1/2011 | Riachentsev |
| 7,975,901 B2 | 7/2011 | Maeda et al. |
| 8,371,316 B2 | 2/2013 | Humphrey et al. |
| 8,790,466 B2 | 7/2014 | Broz et al. |
| 8,801,869 B2 | 8/2014 | Broz et al. |
| 8,876,983 B2 | 11/2014 | Widhalm |
| 9,093,481 B2 | 7/2015 | Levinson |
| 9,131,829 B2 | 9/2015 | Namikawa et al. |
| 9,318,362 B2 | 4/2016 | Leung et al. |
| 9,452,455 B2 | 9/2016 | An et al. |
| 9,595,456 B2 | 3/2017 | Humphrey et al. |
| 9,825,000 B1 | 11/2017 | Humphrey et al. |
| 9,831,215 B1 | 11/2017 | Chen et al. |
| 9,833,818 B2 | 12/2017 | Humphrey et al. |
| 9,933,457 B2 | 4/2018 | Leikermoser et al. |
| 9,941,148 B2 | 4/2018 | Gratix |
| 10,002,776 B2 | 6/2018 | Humphrey et al. |
| 10,109,504 B2 | 10/2018 | Humphrey et al. |
| 10,195,648 B2 | 2/2019 | Broz et al. |
| 10,239,099 B2 | 3/2019 | Humphrey et al. |
| 10,361,169 B2 | 7/2019 | Humphrey et al. |
| 10,399,809 B2 | 9/2019 | Montoya et al. |
| 10,406,568 B2 | 9/2019 | Humphrey et al. |
| 10,741,420 B2 | 8/2020 | Humphrey et al. |
| 10,766,057 B2 | 9/2020 | Tokashiki et al. |
| 10,792,713 B2 | 10/2020 | Humphrey et al. |
| 10,896,828 B2 | 1/2021 | Humphrey et al. |
| 11,035,898 B1 | 6/2021 | Humphrey et al. |
| 2001/0007421 A1 | 7/2001 | Marcuse et al. |
| 2002/0028641 A1 | 3/2002 | Okubo et al. |
| 2002/0071115 A1 | 6/2002 | Batchelder |
| 2002/0079349 A1 | 6/2002 | Macover |
| 2002/0096187 A1 | 7/2002 | Kuwata et al. |
| 2002/0097060 A1 | 7/2002 | Maekawa et al. |
| 2002/0102065 A1 | 8/2002 | Kiani |
| 2002/0112300 A1 | 8/2002 | Muhr-Sweeney |
| 2003/0027496 A1 | 2/2003 | Back et al. |
| 2003/0076490 A1 | 4/2003 | Clark |
| 2003/0092365 A1 | 5/2003 | Grube |
| 2003/0138644 A1 | 7/2003 | Khandros et al. |
| 2003/0180532 A1 | 9/2003 | Namikawa et al. |
| 2003/0200989 A1 | 10/2003 | Humphrey et al. |
| 2004/0029316 A1 | 2/2004 | Schnegg et al. |
| 2004/0083568 A1 | 5/2004 | Morioka et al. |
| 2004/0096643 A1 | 5/2004 | Sato et al. |
| 2004/0200515 A1 | 10/2004 | Saito et al. |
| 2005/0001645 A1 | 1/2005 | Humphrey et al. |
| 2005/0026552 A1 | 2/2005 | Fawcett et al. |
| 2005/0034743 A1 | 2/2005 | Kim et al. |
| 2005/0042958 A1 | 2/2005 | Namikawa et al. |
| 2005/0118414 A1 | 6/2005 | Namikawa et al. |
| 2005/0126590 A1 | 6/2005 | Sato et al. |
| 2005/0255796 A1 | 11/2005 | Haga |
| 2005/0287789 A1 | 12/2005 | Tunaboylu |
| 2006/0008660 A1 | 1/2006 | Parkhe |
| 2006/0029441 A1 | 2/2006 | Atsushi et al. |
| 2006/0065290 A1 | 3/2006 | Broz et al. |
| 2006/0076337 A1 | 4/2006 | Brunner et al. |
| 2006/0151004 A1 | 7/2006 | Terada et al. |
| 2006/0219754 A1 | 10/2006 | Clauberg et al. |
| 2006/0272678 A1 | 12/2006 | Corrado et al. |
| 2006/0289605 A1 | 12/2006 | Park et al. |
| 2007/0125491 A1 | 6/2007 | Yonemizu et al. |
| 2007/0140754 A1 | 6/2007 | Poxon et al. |
| 2007/0153062 A1 | 7/2007 | Shie et al. |
| 2007/0178814 A1 | 8/2007 | Sato et al. |
| 2007/0205753 A1 | 9/2007 | Hau et al. |
| 2007/0284419 A1 | 12/2007 | Matlack et al. |
| 2008/0023028 A1 | 1/2008 | Fujita |
| 2008/0070481 A1 | 3/2008 | Tamura et al. |
| 2008/0207095 A1 | 8/2008 | Goto |
| 2008/0242576 A1 | 10/2008 | Tamura et al. |
| 2009/0197404 A1 | 8/2009 | Yang |
| 2009/0212807 A1 | 8/2009 | Chen et al. |
| 2009/0227048 A1 | 9/2009 | Fang et al. |
| 2009/0248128 A1 | 10/2009 | Nassif et al. |
| 2010/0132736 A1 | 6/2010 | Lin et al. |
| 2010/0149785 A1 | 6/2010 | Dubuc et al. |
| 2010/0170533 A1 | 7/2010 | Terada et al. |
| 2010/0210079 A1 | 8/2010 | Masuoka et al. |
| 2010/0258144 A1 | 10/2010 | Broz et al. |
| 2010/0294435 A1 | 11/2010 | Maeda et al. |
| 2011/0132396 A1 | 6/2011 | Humphrey et al. |
| 2011/0229675 A1 | 9/2011 | Namikawa et al. |

(56) References Cited

U.S. PATENT DOCUMENTS

| | | |
|---|---|---|
| 2012/0048298 A1 | 3/2012 | Humphrey et al. |
| 2012/0258144 A1 | 10/2012 | Klinman et al. |
| 2012/0266461 A1 | 10/2012 | Nickut et al. |
| 2012/0299175 A1 | 11/2012 | Tran |
| 2013/0056025 A1 | 3/2013 | Widhalm |
| 2013/0336689 A1 | 12/2013 | Swing et al. |
| 2013/0336699 A1 | 12/2013 | Vo et al. |
| 2014/0191618 A1 | 7/2014 | Kijima et al. |
| 2014/0251535 A1 | 9/2014 | Ishii et al. |
| 2014/0331421 A1 | 11/2014 | Broz et al. |
| 2014/0338698 A1 | 11/2014 | Humphrey et al. |
| 2015/0187617 A1 | 7/2015 | Leung et al. |
| 2015/0191654 A1 | 7/2015 | Wang |
| 2015/0214095 A1 | 7/2015 | Mischitz et al. |
| 2016/0131702 A1 | 5/2016 | Sinsheimer |
| 2017/0010306 A1 | 1/2017 | Na et al. |
| 2017/0203322 A1 | 7/2017 | Ivri et al. |
| 2017/0239695 A1 | 8/2017 | Hamilton |
| 2018/0017748 A1 | 1/2018 | Mir et al. |
| 2018/0071798 A1 | 3/2018 | Humphrey et al. |
| 2018/0125284 A1 | 5/2018 | Cave |
| 2018/0308821 A1 | 10/2018 | Humphrey et al. |
| 2019/0262871 A1 | 8/2019 | Stark et al. |
| 2019/0262872 A1 | 8/2019 | Stark et al. |
| 2019/0263613 A1 | 8/2019 | Stark et al. |
| 2019/0263614 A1 | 8/2019 | Stark et al. |
| 2020/0067353 A1 | 2/2020 | Kapoor et al. |
| 2020/0200800 A1 | 6/2020 | Stark et al. |
| 2020/0388590 A1 | 12/2020 | Jindo et al. |
| 2021/0005483 A1 | 1/2021 | Humphrey et al. |
| 2021/0151317 A1 | 5/2021 | Humphrey et al. |

FOREIGN PATENT DOCUMENTS

| | | | |
|---|---|---|---|
| CN | 1717285 A | | 1/2006 |
| CN | 1889240 A | | 1/2007 |
| CN | 101252082 A | | 8/2008 |
| CN | 101339898 A | | 1/2009 |
| CN | 103831676 A | | 6/2014 |
| CN | 110895170 A | | 3/2020 |
| DE | 202004009619 U1 | | 9/2004 |
| DE | 102005052308 A1 | | 5/2007 |
| EP | 1890326 A2 | | 2/2008 |
| EP | 1942519 A1 | | 7/2008 |
| GB | 2532255 A | | 5/2016 |
| JP | S5788742 A | | 6/1982 |
| JP | S58131743 A | | 8/1983 |
| JP | S6190434 A | | 5/1986 |
| JP | S6199336 A | | 5/1986 |
| JP | S61124139 A | | 6/1986 |
| JP | S61245536 A | | 10/1986 |
| JP | S63204728 A | | 8/1988 |
| JP | H01276720 A | | 11/1989 |
| JP | H0435778 A | | 2/1992 |
| JP | H05211195 A | | 8/1993 |
| JP | H0596057 U | | 12/1993 |
| JP | H05326471 A | | 12/1993 |
| JP | H07244074 A | | 9/1995 |
| JP | H08264627 A | | 10/1996 |
| JP | H09102453 A | | 4/1997 |
| JP | H09260326 A | | 10/1997 |
| JP | H10154686 A | | 6/1998 |
| JP | H11145212 A | | 5/1999 |
| JP | 2000232125 A | | 8/2000 |
| JP | 2000332069 A | | 11/2000 |
| JP | 2002248433 A | | 9/2002 |
| JP | 2004063669 A | | 2/2004 |
| JP | 2005326250 A | | 11/2005 |
| JP | 2006013185 A | | 1/2006 |
| JP | 2006015457 A | | 1/2006 |
| JP | 2006019616 A | | 1/2006 |
| JP | 2006165395 A | | 6/2006 |
| JP | 2006186133 A | | 7/2006 |
| JP | 2006216886 A | | 8/2006 |
| JP | 2007002225 A | | 1/2007 |
| JP | 2007035684 A | | 2/2007 |
| JP | 2007157902 A | | 6/2007 |
| JP | 2007329377 A | | 12/2007 |
| JP | 2008047601 A | | 2/2008 |
| JP | 2008066710 A | | 3/2008 |
| JP | 2008070280 A | | 3/2008 |
| JP | 2008147551 A | | 6/2008 |
| JP | 2008270270 A | | 11/2008 |
| JP | 2009138027 A | | 6/2009 |
| JP | 2011117938 A | | 6/2011 |
| JP | 4840118 B2 | | 12/2011 |
| JP | 2014107561 A | | 6/2014 |
| JP | 6067951 B1 | | 1/2017 |
| KR | 100392730 B1 | | 7/2003 |
| KR | 20070074398 A | | 7/2007 |
| KR | 20070074426 A | | 7/2007 |
| KR | 100889297 B1 | | 3/2009 |
| KR | 20100029504 A | | 3/2010 |
| KR | 20010063275 A | | 6/2011 |
| KR | 20140066450 A | | 6/2014 |
| KR | 20170127650 A | | 11/2017 |
| KR | 20180108396 A | | 10/2018 |
| TW | 409322 B | | 10/2000 |
| WO | WO9847663 A1 | | 10/1998 |
| WO | WO01/08819 A1 | | 2/2001 |
| WO | WO2010030052 A1 | | 3/2010 |
| WO | WO2012032481 A1 | | 3/2012 |

OTHER PUBLICATIONS

International Test Solutions Publication, Probe Clean™ for Use on Prober Abrasion Plates, dated May 2002, 2 pages.

International Test Solutions Publication, Probe Clean™ Non-Abrasive Method to Clean Loose Debris from Probe Tips, dated May 2002, 1 page.

International Test Solutions Publication, Probe Polish™ on Silicon Wafer, dated May 2002, 2 pages.

International Test Solutions Publication, Probe Polish™ for Use on Prober Abrasion Plates, dated May 2002, 2 pages.

International Test Solutions Publication, Probe Scrub™ Restore Probe Tip Performance and Remove Bonded Debris, dated May 2002, 1 page.

International Test Solutions, Probe Form™ Publication, dated Jul. 7, 2005, 2 pages.

International Test Solutions, Cleaning Parameters for TEL Probers P8 and P8-XL Publication, dated printout dated Sep. 18, 2003, 3 pages. http://web.archive.org/web/20030918014522/http://inttest.net/products/PC2002.pdf.

Anonymous: "Wire Bonding"—Wikipedia—Retrieved from the Internet, 2 pages. https://en.wikipedia.org/wiki/Wire_bonding\.

Neware, Pallawi, B., et al., "Flexible Organic Light Emitting Diodes—FOLED," Oct. 26, 2015, vol. 5, No. 5, pp. 3457-3462.

Zhao, L., et al., "Novel Method for Fabricating Flexible Active Matrix Organiz Light Emitting Diode (AMOLED) Displays," Sep. 21, 2011, 5 pages.

Margaret Rouse, Definition "end effector" from WhatIs.com, Feb. 26, 2009, retrieved on Nov. 7, 2019, 2 pages. https://whatis.techtarget.com/definition/end-effector?vgnextfmt=print.

Istvan Benedek and Luc J. Heymans, "Pressure-Sensitive Adhesives Technology", 1997, Marcel Dekker, Inc., Chapter 6, pp. 186-187. (Year: 1997).

American Society for Testing And Materials, Standard Test Methods of Liner Removal at High Speeds from Pressure-Sensitive Label Stock, Designation: D5375/D5375M-98, current edition approved Apr. 10, 1998, Annual Book of ASTM Standards, vol. 14.02., 3 pages.

ASTM International, Standard Terminology of Adhesives, Designation: D907-15, current edition approved Sep. 15, 2015, 13 pages.

ASTM International, Standard Test Method for Loop Track, Designation: D6195-03, current edition approved Apr. 1, 2011, 5 pages.

ASTM International, Standard Test Method for Pressure-Sensitive Tack of Adhesives Using an Inverted Probe Machine, Designation: D2979-16, current edition approved Oct. 1, 2016, 3 pages.

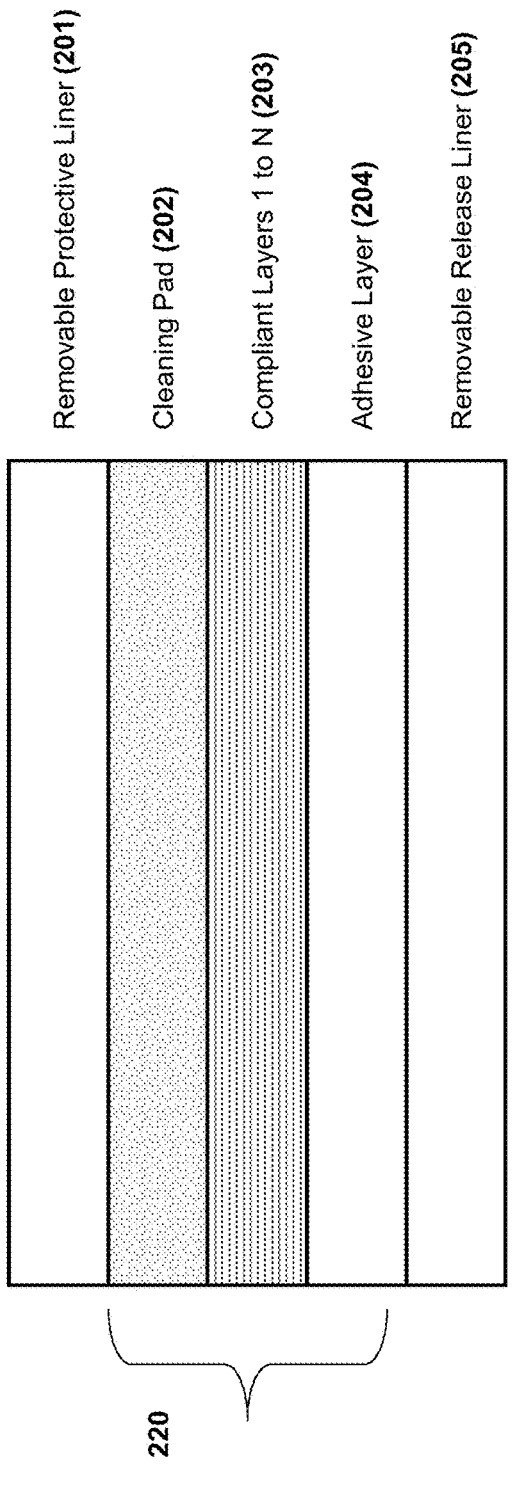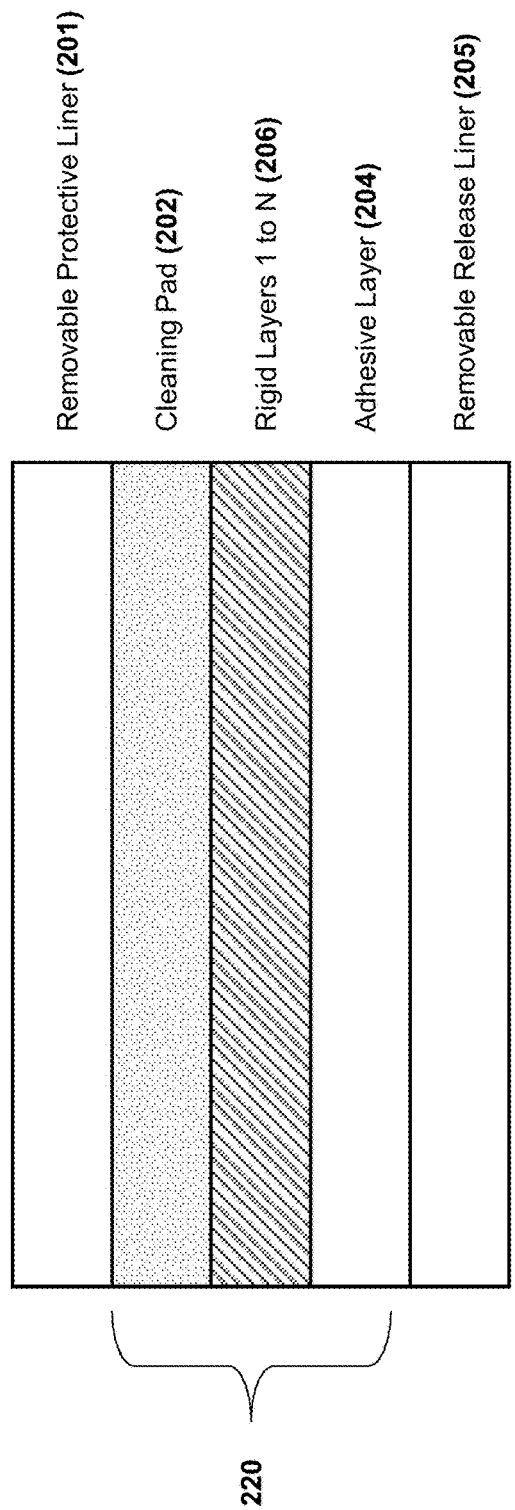

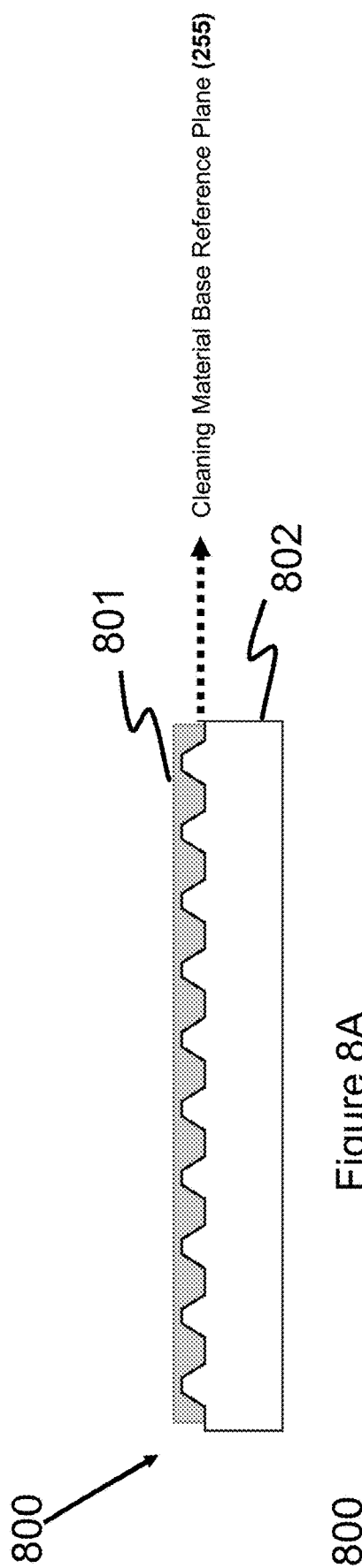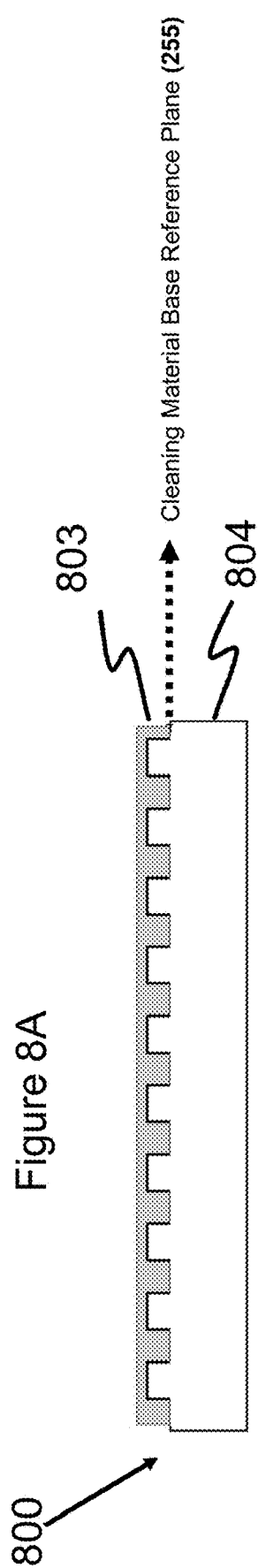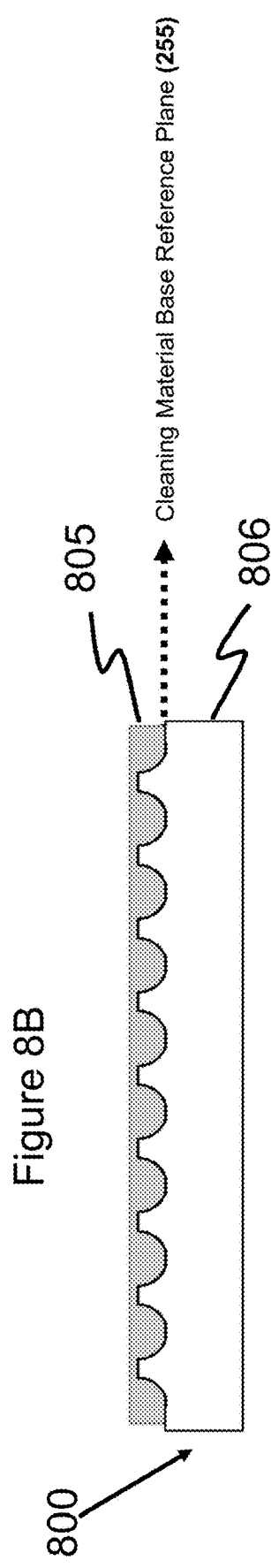

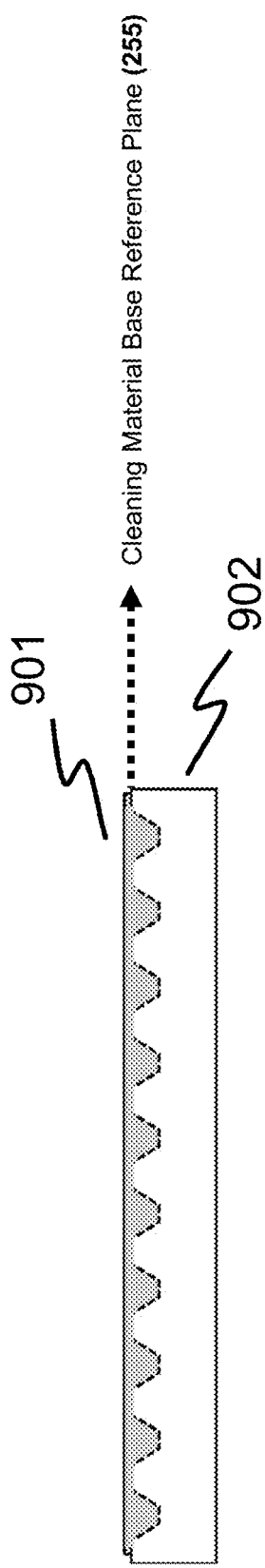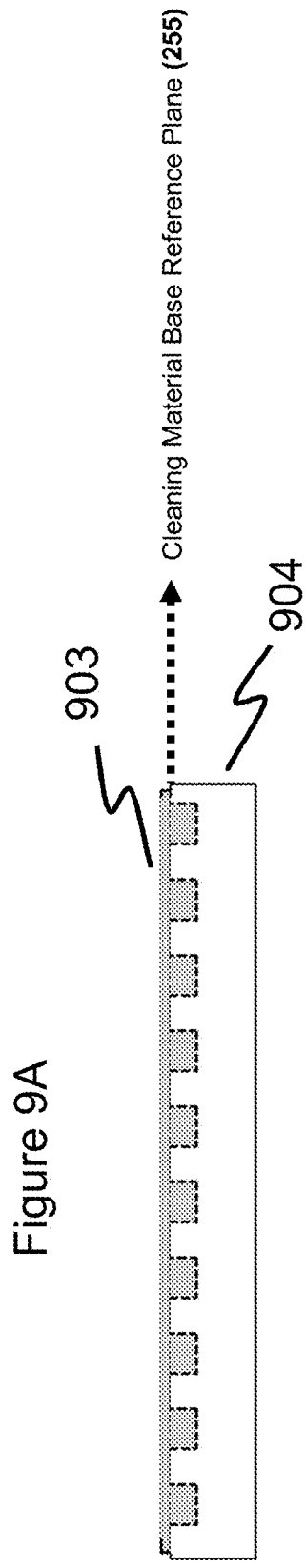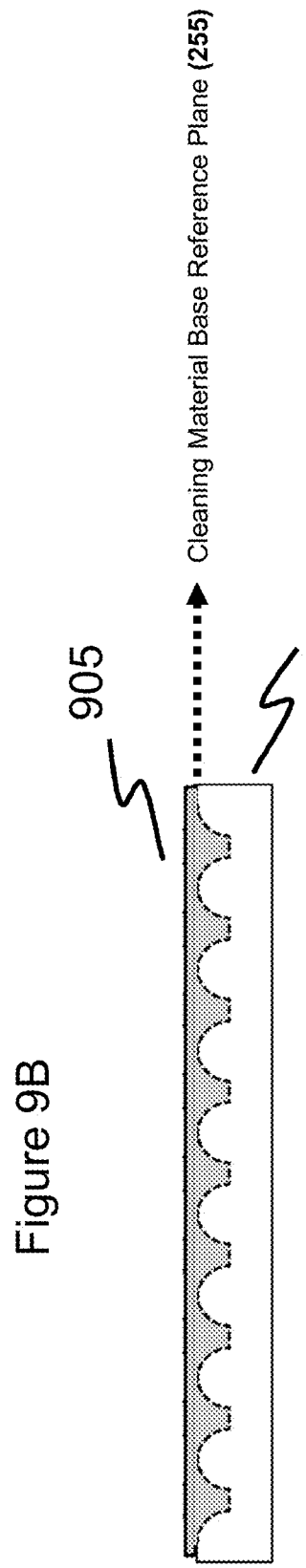
Figure 9A
Figure 9B
Figure 9C

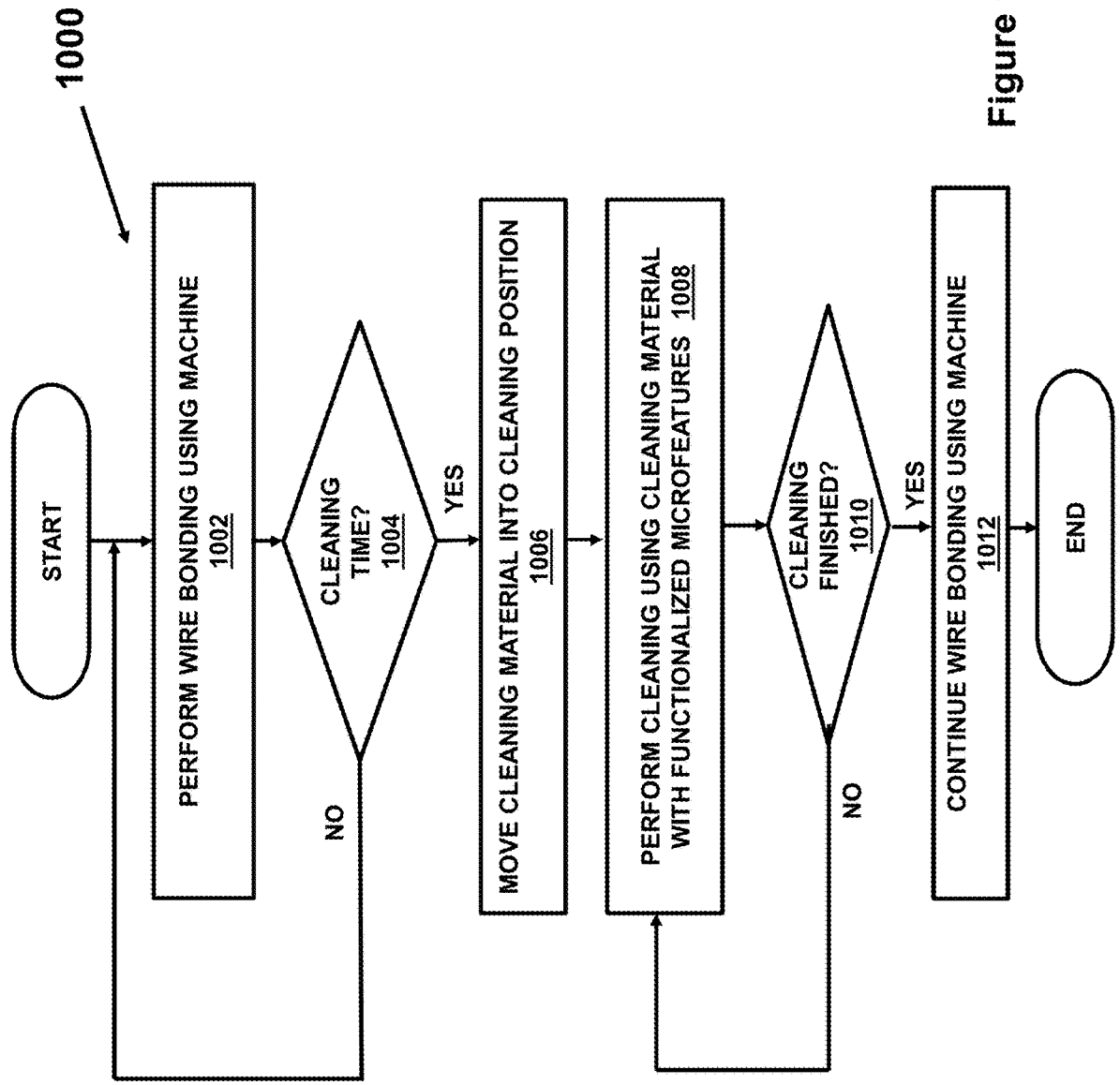

SYSTEM AND METHOD FOR CLEANING WIRE BONDING MACHINES USING FUNCTIONALIZED SURFACE MICROFEATURES

RELATED CASES/PRIORITY CLAIMS

This application is a continuation in part of and claims priority under 35 USC 120 to U.S. patent application Ser. No. 16/684,453 filed on Nov. 14, 2019, the entirety of which is incorporated herein by reference.

FIELD

The disclosure relates generally to a material, device, and method for predictably and consistently cleaning wire bonding machines and capillary tubes.

BACKGROUND

Individual semiconductor (integrated circuit) devices are typically produced by creating a plurality of devices on a semiconductor wafer using well known semiconductor processing techniques that can include photolithography, deposition, and sputtering. Generally, these processes are intended to create fully-functional integrated circuit devices (ICs) at the wafer level. Eventually, the individual IC devices are singulated, or diced, into the separate and individual dies from the semiconductor wafer. The singulated IC devices are assembled for final completion in packages or incorporation into electronic apparatus using well known assembly techniques that can include die attach to a lead-frame, wire bonding or solder ball attach, and encapsulation usually by various molding techniques to provide a body to the package with external electrical connectivity.

In practice, however, physical defects in the wafer itself and/or defects in the processing of the wafer can inevitably lead to some of the dies on the wafer being either fully functional, some of the dies being non-functional, and some of the dies have lower performance or in need of repair. It is generally desirable to identify which of the dies on a wafer are fully functional preferably prior to singulation from the wafer and assembly into consumer devices. Non-functional, lower performing, and repairable devices due to certain physical defects in the wafer, defects in the IC circuit layers, and/or defects related to the semiconductor processing techniques can be identified prior to singulation by a process called wafer-level test (often referred to in the arts as "wafer sort"). Sorting, or binning, IC devices at the wafer level according to the product's capabilities where the product performance is determined by electrical testing can save the manufacturer considerable costs later in the manufacturing process as well as provide increased revenue from the sales of the highest performing devices.

Once the device has been singulated, certain process steps during handling and assembly can inevitably lead to dicing defects, handling defects, assembly and packaging related defects that can only be identified electrically to bin devices as fully-functional, non-functional, or potentially "repairable". In practice, assembled and packaged semiconductor devices are subject to a series of electrical testing processes prior to their final completion or incorporation into electronic apparatus. The process at package level or final test prior to shipment includes, but is not limited to, testing of singulated devices either bare die, packaged IC (temporary or permanent), or variants in between.

Commonly, electrical testing of the IC devices at either the wafer level or package level is accomplished by means of automatic test equipment (ATE) configured mechanically and electrically for stimulating the semiconductor devices, exercising the device according to adaptive testing techniques and functional routines, and examining the output for assessing proper functionality.

At wafer level test, conventional interface hardware is a "probe card" to which pluralities of probe elements that match the layout of the device under test (DUT) input/output (I/O) pads, power, GND and process monitoring pins are connected. More specifically, in the typical wafer testing process, the probe card is mounted to the prober, and probe contact elements (simply referred to as "probes") are brought into contact with bonding pads, solder balls, bumps, pillars, or pillar bumps formed on the dies of the wafer. By exerting controlled displacement of the probe tips against the bonding pads, solder balls, bumps, pillars, or pillar bumps an electrical connection is achieved allowing the power, ground and test signals to be transmitted. Repeated scrub, deformation, and penetration of the probe tips against the bonding pads, solder balls, bumps, pillars, or pillar bumps produces debris and contaminants that adhere and accumulate onto the probe contact surface.

At the package level test, a tester load board provides an interface between automated test equipment (ATE), or manual test equipment, and the DUT. The tester load board conventionally includes one or more contactor assemblies, sometimes referred to as "test socket(s)" into which DUT(s) is (are) inserted. During the testing process, a DUT is inserted or placed into the socket by the handler and held into position for the duration of testing. After insertion into the socket, the DUT, via the pin elements, is electrically connected to the ATE through the tester load board, its subassemblies, and other interfacing apparatus. Contact pin elements associated with the ATE are placed in physical and electrical contact with the metallized contact surfaces of the DUT. These surfaces may include test pads, lead wire, pin connectors, bond pads, solder balls, and/or other conductive media. The functionality, static and dynamic performance tests of DUTs is evaluated through various electrical inputs and measured responses on outputs. With repeated testing, the contact element tip can become contaminated with materials such as aluminum, copper, lead, tin, gold, bi-products, organic films or oxides resulting from the wafer and semiconductor device manufacturing and testing processes.

One of the major challenges encountered with both types of IC testing (wafer level and package level) is ensuring optimal electrical contact between the contact pins associated with the contactor element, and the contact surfaces of the DUT. In each test procedure, with repeated contact the pin contact elements onto bonding pads, solder balls, bumps, pillars, or pillar bumps, debris and other residuals will accumulate and contaminate the contact area of the pin elements. This debris may originate from the testing and handling process itself or may include manufacturing residue from the device fabrication and/or assembly process(es) or from other sources.

In addition to the presence of contaminants, repeatedly forcing electrical current through the small intermetallic "a-spots" of the contact pins can degrade the conductivity characteristics of contact surfaces, thus affecting the intermetallic quality for proper electrical testing. As the contaminants accumulate, coupled with degradation of contact surfaces, the contact resistance (CRES) rises and reduces the reliability of the tests. Increasing and unstable CRES can impact yield and/or test time as yield recovery testing increases. Such erroneous readings can lead to the false rejection of otherwise good DUTs resulting in, often dramatic, yield loss. Yield recovery may be possible through multi-pass testing; however, retesting devices multiple times to verify a device or to attain yield recovery causes the overall production costs to increase, reduce throughput, affect assembly, and create a possibility for reductions in long-term reliability.

High performance demands for wafer level and package level test contactor technologies have furthered the development of uniquely shaped and customized contact elements with predetermined and engineered mechanical and electrical performance properties. Many of the new advanced contact technologies have unique contact element geometries and mechanical behavior to facilitate consistent, repeatable, and stable electrical contact. Some of the technologies are constructed using lithographic assembly techniques, some are built using MEMS based processes; while others are fabricated with high accuracy micro-machining techniques. Improved electrical characteristics of the contactors are also attained using various materials with improved electrical performance and resistance to oxidation. The contact elements are engineered to facilitate consistent oxide penetration while reducing the applied bearing force onto the bonding pads, solder balls, bumps, pillars, or pillar bumps. However, it is still necessary to make physical contact with the bonding pads, solder balls, bumps, pillars, or pillar bumps; thereby, generating debris and contamination that could affect the results from the electrical performance testing procedures.

Typically, the generated debris needs to be periodically removed from the contact elements to prevent a build-up that causes increased contact resistance, continuity failures and false test indications, which in turn result in artificially lower yields and subsequent increased product costs and reduced throughput.

In response to the problem of particles adhering to the contact element and supporting hardware, a few techniques have been developed. For example, one technique uses cleaning materials composed of a silicone rubber which provides a matrix for abrasive particles. In addition, a cleaning wafer, or a cleaning medium mounted onto an abrasive ceramic cleaning block which is rubbed against the probe needles may be used or a rubber matrix with abrasive particles and a brush cleaner made of glass fibers also may be used. In one technique, the probe needles may be sprayed or dipped in a cleaning solution. In another technique, open cell foam based cleaning device with a random surface morphology of voids and variable heights may be used.

In one conventional contact element cleaning process, some combination of brushing, blowing, and rinsing the contact pins and/or contactor bodies are employed. This process requires stopping the testing operation, manual intervention to perform the cleaning, and possibly removing the test interface (probe card, socket, etc.) from the test environment. This method provides inconsistent debris removal and may not provide sufficient cleaning action within the geometric features of shaped contact elements. After cleaning, the test interface must be reinstalled, and the test environment reestablished so that testing may resume. In some cases, the contact elements are removed, cleaned, and replaced resulting in elevated costs due to unscheduled equipment downtime.

In another conventional method, a cleaning pad with an abrasive surface coating or abrasively coated polyurethane foam layer is used to remove foreign materials adhering to the contact elements. Adherent foreign materials are abraded off the contact elements and supporting hardware by repeatedly scrubbing the contact elements against (and possibly into) the cleaning pad. The process of cleaning using an abrasive pad burnishes the contact element, but it does not necessarily remove debris. In fact, the burnishing causes abrasive wear to the contact elements thereby changing the shape of the contact geometry, changing the contact performance, and shortening the useful life of the contactor.

Maximum cleaning efficiency is attained when the removal of the debris from the contact element and supporting hardware is performed consistently and predictably during the cleaning process without affecting the performance of the contact elements. The process of cleaning using an abrasive pad constructed from open celled foam does not provide consistent cleaning. In fact, the burnishing action by the randomly oriented and uncontrolled foam structures causes non-uniform abrasive wear as well as preferential abrasive wear to the contact elements thereby unpredictably changing the shape of the contact geometry and mechanical performance of the contact element and support hardware; thereby, unpredictably shortening the useful life of the contactor.

In the industry, it has been seen that the tester interface hardware consisting of a plurality of contact elements, as many as 150,000 test probe elements, and the support hardware can cost more than $1M per ATE test cell. Premature wear-out and damage due to improper or non-optimal cleaning practices can equate to millions of US dollars per annum per ATE test cell. Therefore, with tens of thousands of ATE test cells operating worldwide, the impact to the repair, maintenance, and replacement costs can be very substantial.

Another attempt to improve upon the conventional probe cleaning process includes using a tacky abrasively filled or unfilled polymeric cleaning material to remove the foreign materials. More specifically, the polymer pad is brought into physical contact with the contact elements. Adherent debris is loosened by the tacky polymer and sticks to the polymer surface; thereby removed from the contact elements and other test hardware. The polymer materials are designed to maintain the overall shape of the contact elements; however, interaction with the polymer layer may not provide sufficient cleaning action within the geometric features of shaped contact elements.

When cleaning with abrasively filled or abrasively coated materials films that have a continuous, uniform surface or a surface with randomly oriented and randomly spaced surface features, preferential abrasion is manifested through "edge pin" effects (for example, peripheral contact elements of a test probe array are abrasively worn at different rates than the contact element within the array); or through "neighbor pin spacing" effects (for example, closely spaced contact elements are worn at different rates than widely spaced contact elements); or through "neighbor pin orientation" effects (for example, spatial proximity of contact elements can cause preferential and asymmetric wear of contact elements). Non-uniform abrasive wear of contact elements and support hardware will affect the performance consistency during the IC semiconductor device testing and could result in unexpected yield loss, equipment downtime, and repair costs.

Typical contact element cleaning processes at wafer level and package level can be expensive for the end-user since the contactors may be uncontrollably worn away at different rates by the abrasive-based contact cleaning processes. When using abrasive particles of the rate of wear-out or dimensional reduction for critical contact element geometries can be dramatically affected by relatively small changes (approximately 2 to 3%) to the compliance of the abrasive material layers, surface features, and that of the under-layers. With thousands of IC device testing units (probers and handlers) operating worldwide, the impact to the industry from maintaining clean contact elements without premature wear out during testing can be very substantial.

None of these methods adequately clean these testing machines nor the contact elements of these testing machines that have critical contact element geometries. Furthermore, none of these known methods adequately clean wire bonding machines and capillary tubes of the wire bonding machined and accordingly, there is a need for improved methods and apparatuses for cleaning and maintaining the wire bonding machine and capillary tube.

BRIEF DESCRIPTION OF THE DRAWINGS

FIG. 3A is a sectional view of a known cleaning medium that has one or more intermediate complaint material layers below a cleaning pad layer of predetermined properties and a protective liner;

FIG. 3B is a sectional view of a known cleaning medium with one or more intermediate rigid material layers below a cleaning pad layer of predetermined properties and a protective liner;

FIG. 8A is a sectional view of a cleaning media layer with predetermined properties such as tack, hardness, abrasiveness, etc., applied to a plurality of evenly spaced and predefined, "positive" micro-pyramids with predetermined properties;

FIG. 8B is a sectional view of a cleaning media layer with predetermined properties such as tack, hardness, abrasiveness, etc., applied to a plurality of evenly spaced and predefined, "positive" micro-columns with predetermined properties;

FIG. 8C is a sectional view of a cleaning media layer with predetermined properties such as tack, hardness, abrasiveness, etc., applied to a plurality of evenly spaced and predefined, "positive" curved pyramidal microfeatures with predetermined properties;

FIG. 9A is a sectional view of a cleaning media layer with predetermined properties such as tack, hardness, abrasiveness, etc., applied to a plurality of evenly spaced and predefined, "negative" micro-pyramids with predetermined properties;

FIG. 9B is a sectional view of a cleaning media layer with predetermined properties such as tack, hardness, abrasiveness, etc., applied to a plurality of evenly spaced and predefined, "negative" micro-columns with predetermined properties;

FIG. 9C is a sectional view of a cleaning media layer with predetermined properties such as tack, hardness, abrasiveness, etc., applied to a plurality of evenly spaced and predefined, "negative or inverted" curved pyramid microfeatures with predetermined properties;

FIG. 10 is a flowchart showing a method for cleaning wire bonding machines and capillary tubes using the various embodiments of the disclosed cleaning material.

DETAILED DESCRIPTION OF ONE OR MORE EMBODIMENTS

Figure 1A:
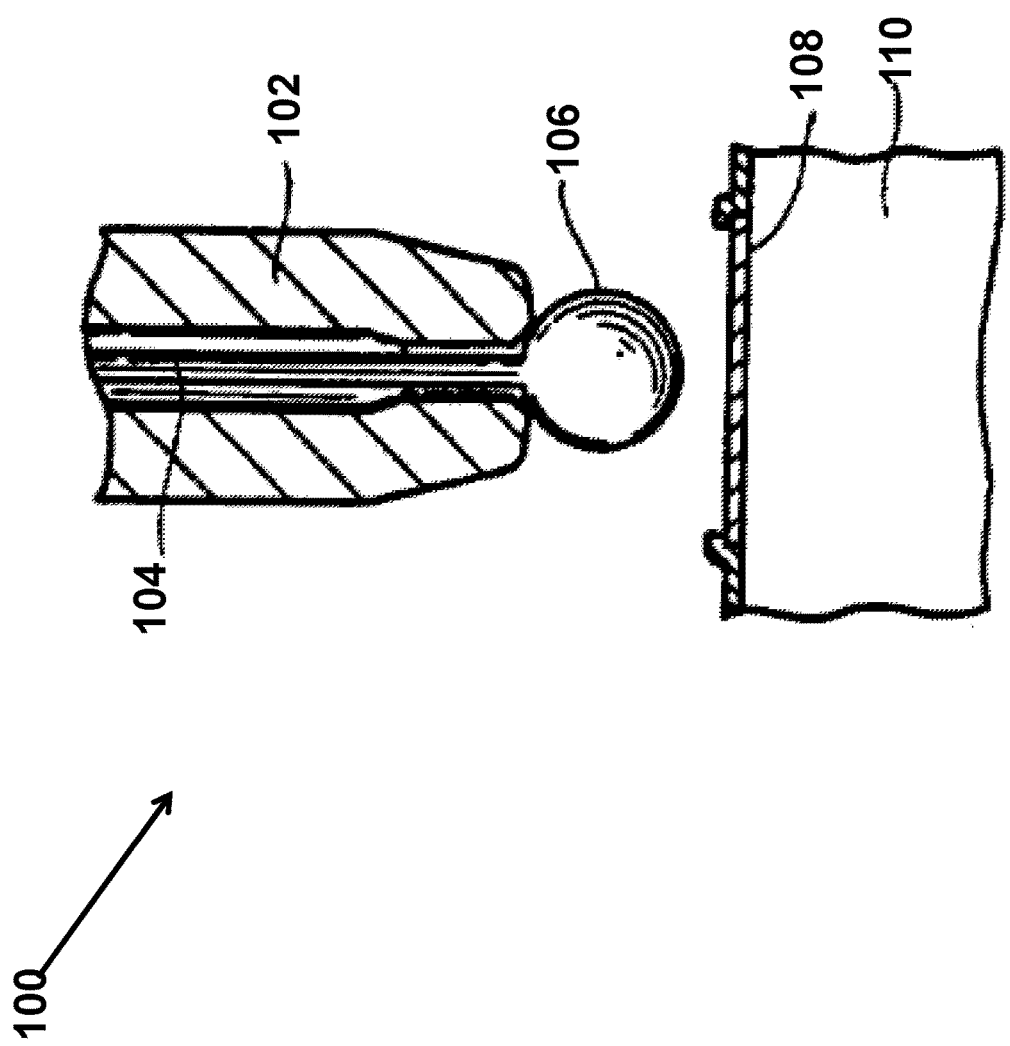
FIG. 1A illustrates a known wire bonding assembly machine 100 having a capillary tube 102 being used for a wire bonding operation.

The disclosure is particularly applicable to a cleaning device and method for the capillary tube of a wire bonding machine. It is in this context that the disclosure will be described; however, it can be appreciated that the cleaning material, device, and method have greater utility since it may be used to clean any device that has a capillary tube that becomes clogged over time with various materials, it can also be used to clean or refurbish other assembly machines and the device, mechanism and method may be implemented using variations of the embodiments disclosed below that are still within the scope of the disclosure.

In one embodiment, a cleaning device and method are disclosed that incorporate a cleaning pad construction with a surface functionalization, or surface tunability. Surface functionalization with predetermined microfeatures of custom geometries effectively facilitates adjustable behavior altering the mechanical properties of a cleaning surface in order to achieve specific performance goals such as contact surface cleaning, tip shaping, inner surface cleaning, debris removal and collection, and surface texturing. Materials with structurally functionalized well-regulated structures surfaces contain microscale features that are produced in a controlled manner through imprinting, molding, casting, coating, film deposition, spray deposition or other surface modifications at a microscale level, with the purpose for improving the material cleaning efficiency and mechanical performance. In addition, the equipment and manual labor to repair and replace contactors that have been worn away by an abrasive contact cleaning process adds additional costs to the task performed.

In one embodiment, the cleaning material may be a complaint, semi-rigid, or rigid media that has a surface functionalized with 3-dimensional (3D) microfeatures that provide performance characteristics not possible with flat, non-functionalized surfaces for having specific abrasive and debris removal efficacies to clean the wire bonder capillary tube. Surface functionalization, or surface tunability, with adjustable behavior is an effective way for altering the mechanical properties of a cleaning surface to achieve specific performance goals such as contact surface cleaning, debris removal and collection, cleaning an inside surface of the capillary tube and surface texturing. Materials with structurally functionalized surfaces contain microscale features that are produced in a controlled manner through imprinting, molding, casting, coating, film deposition, spray deposition or other surface modifications at a microscale level, with the purpose for improving the material cleaning efficiency and mechanical performance.

In one embodiment, a functionalized coating with predetermined properties, such as thickness, hardness, tack, etc., can be applied to the surface of the cleaning pad, across existing structural features, and across microfeatures to provide a new class of cleaning materials that can be tailored and optimized for electrical contact elements and structures applications and perform a well-defined set of functions. A high level of cleaning efficacy can be obtained through functionalizing the cleaning surface in order to emulate the capillary tube features of the wire bonding machine combined with tacky or abrasive surface coatings, exposed abrasive particles for variable abrasive efficiency, and depending on the type and shape of capillary tube being cleaned, the composition and the quantity of debris to be removed, and the affinity of the debris to the capillary tube surfaces.

In more detail, a functionalized cleaning material may be constructed with the predetermined capillary tube surface features or functional surface coatings on top of one or more support layers, each with predetermined mechanical, material, and dimensional characteristics, such as abrasiveness, density, elasticity, tackiness, planarity, thickness, porosity, etc. The cleaning device may have a sacrificial top protective layer of material that may be applied before, during, or after the fabrication process to protect and isolate the cleaning material surface from contamination during manufacturing process and manual handling operations. The sacrificial layer is removed upon installation into the wire bonding machine and is used to ensure that the working surface of the cleaning material is free of any contamination that would compromise the cleaning performance of the capillary tube surfaces by the cleaning material.

The cleaning layer and functionalized 3D-surface features may be made of solid elastomeric materials or porous, open celled or closed foam materials that may include rubbers and both synthetic and natural polymers as well as polyurethanes, acrylics, etc., or other known elastomeric materials. The functionalized surface features may have predetermined abrasiveness, elasticity, density and surface energy parameters that may allow the capillary tube structure to deform and penetrate the elastomeric material to remove the debris from the contact area of the capillary tube without damage to the capillary tube, while retaining the integrity of the elastomeric matrix.

The cleaning material also may have a multi-layered structure in which one or more complaint layers are arranged or stacked to attain a predetermined overall performance so that when the capillary tube penetrate and touch the functionalized features and the pad surface, a defined reciprocal force is imparted by the material into the contact area and 3D structures to increase the efficiency at which the debris and contaminants are removed.

In one embodiment (examples of which are shown in FIGS. 4A-4C and 5), the cleaning material may have a surface layer populated with a plurality of predefined, "positive" geometric microfeatures such as columns, pyramids, or other such structural microfeatures, of a pre-determined aspect ratio (diameter or length and width to height) and/or cross-section (square, circular, triangular, etc.). In another embodiment (examples of which are shown in FIGS. 6A-6C and 7), the cleaning material may have a surface layer populated with a plurality of predefined "negative" or "inverse" geometric microfeatures. The "positive" and "negative" microfeatures may be made of solid elastomeric materials or closed foam materials that may include rubbers and both synthetic and natural polymers as well as polyurethanes, acrylics, polymers, etc., or other known elastomeric materials. The surface layer may have abrasive particle loading or exposed abrasives to improve debris removal and collection efficiency.

In other embodiments, the "positive" and "negative" microfeatures may have abrasive particles applied to the top surface, along the length of the microfeature, within the body of the microfeature, or at the base of the micro-feature. In particular, a typical microfeature (whether a positive microfeature or a negative microfeature) could have varying cross-section widths of 15-μm or less, with a height of 400-μm or less, at a spacing of 250-μm or less and an average abrasive particle size of less than 30 um. Typical abrasives that may be incorporated into and across the material layers and features may include aluminum oxide, silicon carbide, tantalum oxide, and diamond although the abrasive particles may also be other well-known abrasive materials with Mohs Hardness of 7 or greater.

In some embodiments, the microfeatures are built, molded, or formed with a predetermined geometry to attain a predetermined compliance and movement so that when the capillary tube end touches the pad surface, a reciprocal force is imparted by the material into the contact area to increase the efficiency at which the debris and contaminates are removed. The functional microfeatures have predetermined dimensions to provide predictable and uniform reciprocal forces onto the capillary tube.

In another aspect of the cleaning device, the microfeatures may have a particular surface matte or patterned texture or finish such that the wire bonder is capable of detecting the surface of the cleaning pad. The surface texture and roughness of the cleaning material may also contribute to the cleaning efficiency of the working surface polymer material.

In one aspect of the method, the cleaning medium may be manually placed in a wire bonder, in a predetermined location so that capillary tube will interact with the cleaning medium periodically to remove debris and/or clean the contact surfaces without excessively wearing out the end of the capillary tube. In another aspect of the method, a method for cleaning the capillary tube is provided wherein the method comprises loading the cleaning medium into the wire bonder in a form similar to a semiconductor wafer, a singulated IC device, or a packaged IC device being bonded with the cleaning medium having a top surface of functionalized microfeatures that have predetermined properties, such as abrasiveness, tack, hardness, that clean the capillary tube. The method further comprises contacting the capillary tube with the cleaning medium during the normal operation of the wire bonder so that any debris is removed from the capillary tube during the normal operation of the wire bonder. In other words, the wire bonder that is configured to normal wire bonding operation can also perform a cleaning process with the cleaning material with microfeatures without being reconfigured for the cleaning or having the capillary tube removed from the wire bonding machine.

When the wire bonder can detect the surface of the cleaning pad, then the wire bonder is able to be set into an automatic cleaning mode. In the automatic cleaning mode, the wire bonder will automatically determine when to clean the capillary tube, locate the cleaning device, clean the capillary tube and then return to wire bonding operations. After repeated wire bonding, pad materials and other surface contaminants will be accumulated on the capillary tube inside and outside surface and tip. Such loose debris can substantially reduce the success of the wire bonding operation such that a cleaning operation is executed with an "on demand" functionality. Alternatively, the wire bonder machine can be programmed to execute the cleaning operation at LOT start, LOT end, or after a predetermined number of wire bonds. In another embodiment of the cleaning device, the layers of the cleaning medium may be formed from conductive, insulative or resistive materials such that a wire bonder detects a surface using conductance or capacitive method to detect the surface of the cleaning medium.

FIG. 1A illustrates a known wire bonding assembly machine 100 having a capillary tube 102 being used for a wire bonding operation. The wire bonding assembly machine has the various known elements of a wire bonding machine (not shown in FIG. 1A) that allow the wire bonding assembly machine to create wire bonds for semiconductor devices and the like. The wire bonding assembly machine may be used to create wire bonds for any device, component, die, etc. in which it is desirable to be able to create wire bonds. FIG. 1A shows a portion of that machine 100 and particularly shows a capillary tube 102 with an outlet and a wire 104, such as cooper or gold, which passes through the capillary tube. The capillary tube 102 is typically removably attached to the wire bonding machine so that, in a conventional cleaning process, the capillary tube may be removed and periodically cleaned and refurbished. The wire bonding machine may have a mechanism (not shown in FIG. 1A) that is used to heat an end of the wire extending from the capillary tube to form a free air ball of molten wire 106. The mechanism to heat the wire may be, for example, an electrode or another mechanism. The capillary tube 102 may then be lowered towards a semiconductor device 108 on a substrate 110 and the molten wire ball is compressed between the end of the capillary tube and a heated metal pad or other metal frame producing a mechanical connection that is intended to form an eutectic bond between the wire ball and the bond pad or frame. The capillary tube then may be raised while the wire is fed through the capillary tube leaving the wire ball attached to the die bond pad or frame.

Figure 1B:
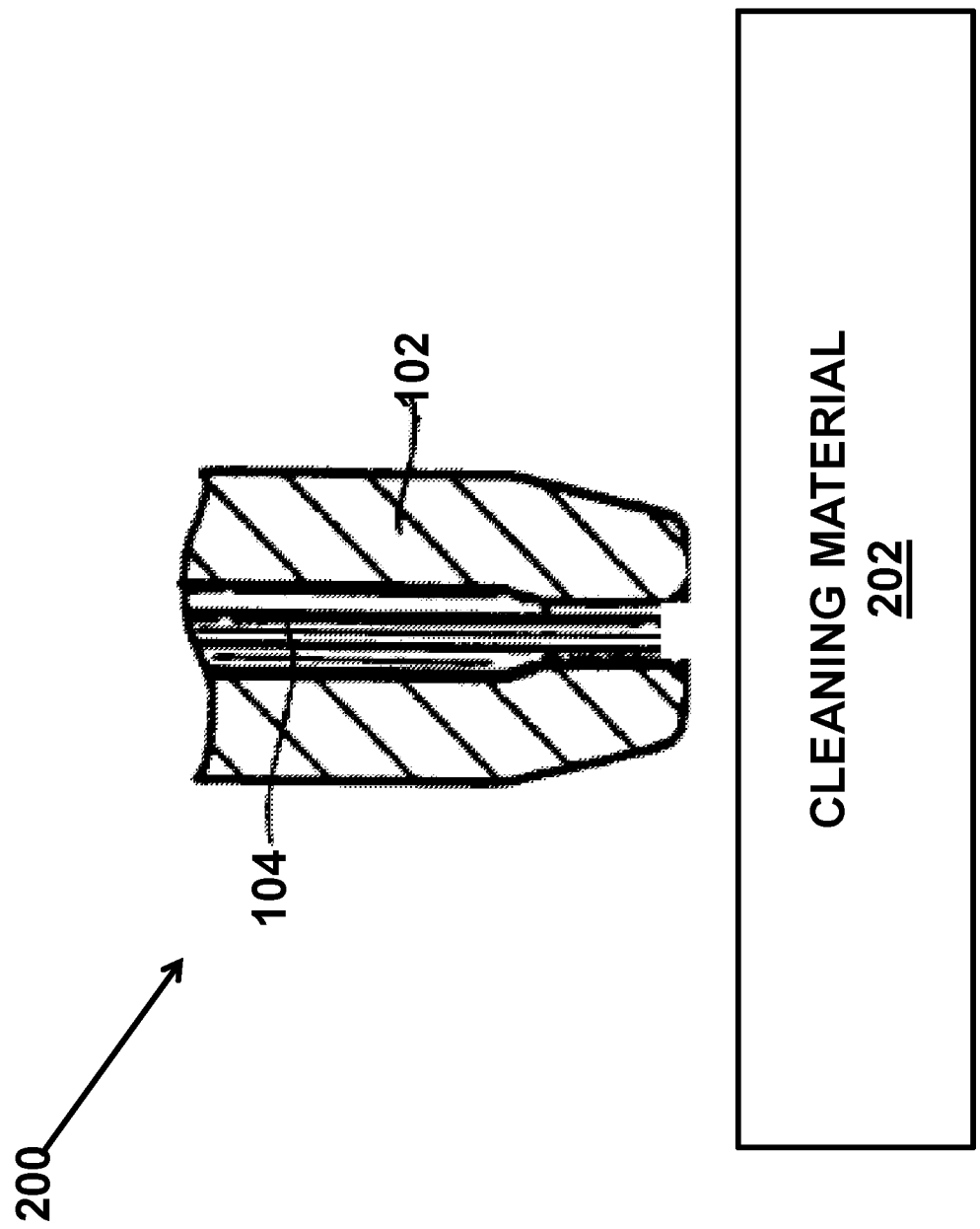
FIG. 1B illustrates a known wire bonding assembly machine having a capillary tube during a cleaning operation 200 using a cleaning material 202.

FIG. 1B illustrates a known wire bonding assembly machine having a capillary tube during a cleaning operation 200 using a cleaning material 202. In particular, while the capillary tube 102 remains connected to the wire bonding machine (unlike the typical cleaning process as described above), the end of the capillary tube 102 may be inserted into the cleaning material 202 so that debris inside of the capillary tube and/or adjacent the outlet of the capillary tube 102 may be removed from the capillary tube and trapped/retained in the cleaning material 202.

Figure 2A:
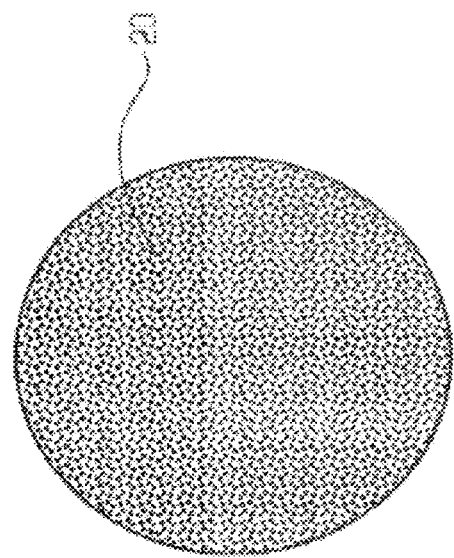
FIG. 2A is a top view of a typical cleaning device with cleaning pad that can be applied to a wafer surface.
Figure 2B:
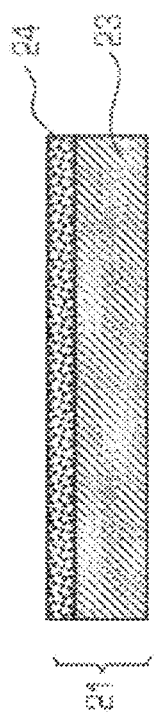
FIG. 2B is a sectional view of a typical cleaning device with a cleaning pad applied to a substrate surface.
Figure 2C:
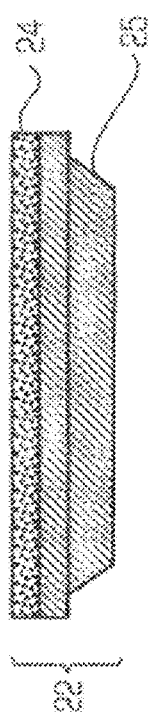
FIG. 2C is a sectional view of a typical cleaning device with a cleaning pad applied to a substrate that approximates an IC package.

FIGS. 2A, 2B, and 2C illustrate three typical different types of cleaning devices manufactured with a cleaning medium applied to various substrate materials, different size substrates, different shape substrates or without a substrate for some applications. As shown in FIGS. 2A and 2B, cleaning device 20 and 21, respectively, may include a substrate 23 and a cleaning medium, or pad, 24 secured, adhered, or applied to a surface of a wafer or to substrate of known geometry, respectively. The substrate 23 may be polymer, plastic, metal, glass, silicon wafer, ceramic, or any other similar (rigid, semi-rigid or flexible) material.

FIGS. 3A and 3B illustrate an existing cleaning medium 220 made from a cleaning pad layer 202 of predetermined properties, such as hardness, elastic modulus, tack, etc., and some combination of compliant under-layers 203 (FIG. 3A) or rigid under-layers 206 (FIG. 3B), that contribute to the cleaning of the contact elements that contact the pad. The cleaning medium 220 may also have a removable protective layer 201 that is installed prior to the intended usage for contact element cleaning in order to isolate the surface cleaning pad layer from non-test related contaminants. The cleaning medium 220 can have one or more intermediate layers 203 and 206 attached to and below the cleaning pad layer. The combinations of layers produce material properties unavailable from the individual constituent materials, while the combinations of matrix, abrasive particles, and geometries can maximize cleaning performance. Installation of the cleaning device onto the predetermined substrate material is performed by removal a second release liner layer 205 (made of the same material as the first release liner layer) to expose the adhesive layer 204, followed by application onto the substrate surface by the adhesive layer 204. The adhesive layer 204 may then be placed against a substrate to adhere the cleaning device 220 to the substrate. The substrate may be a variety of different materials as described in the prior art which have different purposes.

Now, a cleaning medium with functional microfeatures for use with a wire bonder is described in more detail with reference to the accompanying drawings and embodiments. As shown, for example in FIG. 5, a cleaning media 221 may have abrasiveness that loosens and shears debris from contact elements. Using pre-determined volumetric and mass densities of abrasive particles; the abrasiveness of the pad can be systematically affected in order to round or sharpen the probe tips. Typical abrasive material and particle weight percentage loading within the cleaning material layer can range for 0% (unloaded) to 500% weight percent. Typical abrasives that may be incorporated into the materials may include aluminum oxide, silicon carbide, and diamond although the abrasive material may also be other well-known abrasive materials. The abrasive may include spatially or preferentially distributed particles of aluminum oxide, silicon carbide, or diamond although the abrasive particles may also be other well-known abrasive materials with Mohs Hardness of 7 or greater. Controlled surface tackiness of the cleaning layer will cause debris on the contact element to preferentially stick to the pad and therefore be removed from the contact element during the cleaning operation. The abrasive particles may be distributed in the body of each microfeature as described below.

Figure 4C:
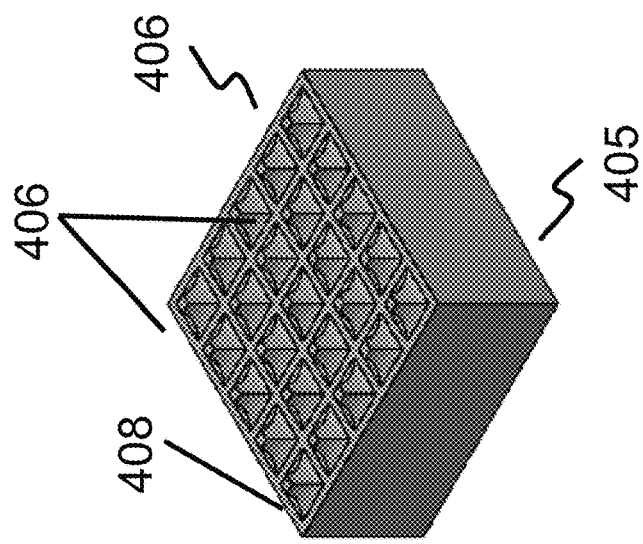
FIG. 4C is an isometric view of a cleaning pad layer with a plurality of evenly spaced and predefined, "positive" curved pyramidal microfeatures with predetermined properties.
Figure 4B:
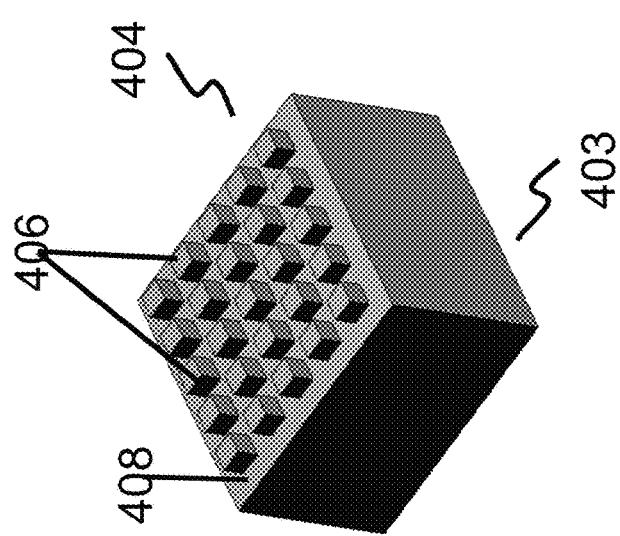
FIG. 4B is an isometric view of a cleaning pad layer with a plurality of evenly spaced and predefined, "positive" micro-columns with predetermined properties.
Figure 4A:
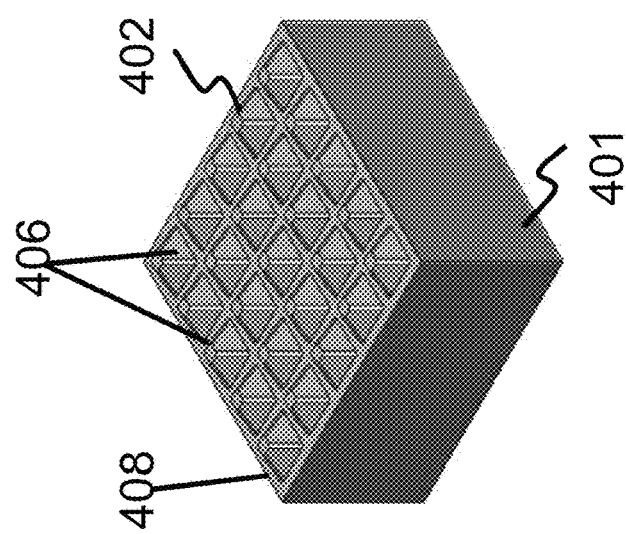
FIG. 4A is an isometric view of a cleaning pad layer with a plurality of evenly spaced and predefined, "positive" micro-pyramids with predetermined properties.
Figure 5:
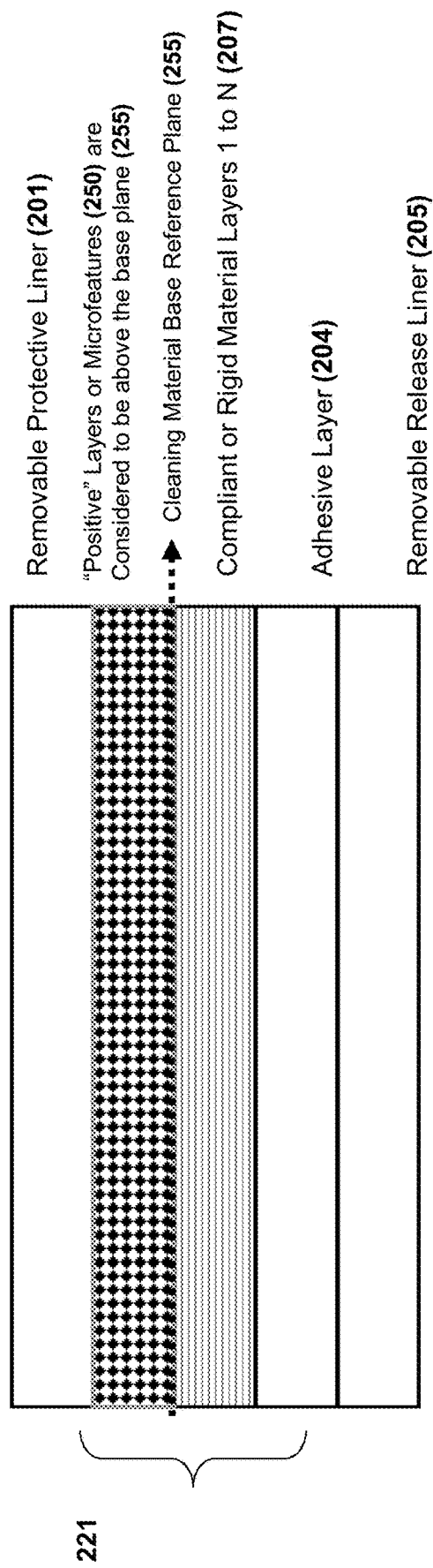
FIG. 5 is a sectional view of a cleaning medium that has one or more intermediate complaint material layers below a cleaning pad layer with a plurality of evenly spaced and predefined, "positive" microfeatures which are above the surface reference plane and a removable protective liner.

In an embodiment of the cleaning medium 221 (shown in FIG. 5), a maximum cleaning efficiency of the cleaning material 221 can be improved using a plurality of "positive" uniformly shaped and regularly spaced, geometric microfeatures in a microfeature layer 250. Examples of different embodiments of the positive microfeatures are shown in FIGS. 4A-4C that show a plurality of micro-pyramids 401, a plurality of micro-columns 403, or a plurality of curved micro-pyramids 405, of a pre-determined geometry. In FIG. 5, the cleaning media 221 is constructed from a single layer of cleaning pad with "positive" microfeatures 250 onto a combination of intermediate compliant or rigid layers 207 with pre-determined predetermined properties. In other embodiments, the microfeatures may be variably spaced across the cleaning medium 221. The cleaning pad layers 202 and 203 described above and the cleaning pad layers described below the cleaning material reference plane 255 may provide predetermined mechanical, material, and dimensional characteristics to the cleaning material. For example, the cleaning pad layer may provide abrasiveness (described in more detail below), a specific gravity (of a range of 0.75 to 2.27 for example) wherein specific gravity is the ratio of the density to the density of water at a particular temperature, elasticity (of a range of 40-MPa to 600-MPa for example), tackiness (of a range of 20 to 800 grams for example), planarity, and thickness (a range between 25-um and 300-um for example). The selection of the materials and the layers is determined based on the required reciprocal force necessary to facilitate an effective cleaning action. For example, high rigidity materials will have a greater reciprocal that would be required in the removal of tenaciously adherent materials. Highly compliant materials would be selected when cleaning fragile or small diameter contact elements.

As an example of one type of functional "positive" microfeature construction, the microfeatures shown in FIGS. 4A, 4B, 4C can be created using a combination of precision fabrication methods such as casting or molding whereby the cleaning pad is built such that a plateau of each microfeature (a top portion 406 of each microfeature) has a dimension of less than 40 um, a height of each microfeature from a base reference plane 408 of less than 500 um, and a plateau-to-plateau spacing (a distance between each microfeature) of less than 250 um. In the example 401 shown in FIG. 4A, each pyramid microfeature 402 has a 25 um square plateau, with a 40 um height, at a plateau-to-plateau spacing of 100 um. For this construction, the 3D features are attained through a precision fabrication process such that the cleaning pad and functionalized microfeatures have a uniform composition. The size and geometry of the "positive" microfeatures may vary according the configuration and material of the contact elements to achieve a pad that will remove the debris but will not damage the probe elements. Generally, the "positive" microfeatures can have several types of geometries including pyramids 401, round or square columns 404 with uniform plateau, or various curved shapes 403 with smaller than 40 um square or round plateaus, etc. The microfeature type and "positive" geometry may be adjusted during the manufacturing of a cleaning layer such that the material can be used reshape, sharpen or refurbish, the probe element tips and the probe element structure.

The dimensions of the "positive" features may have a base-to-top of each microfeature above the base reference plane 408 of 25 um to 500 um, a top surface area geometry which can be flat or shaped and that has dimensions ranging in XY dimensions from 20 um up to the XY dimensions of the microfeature base, sides of the positive feature can be straight or curved, and plateau-to-plateau spacing (the distance between each microfeature) of 50 um to 250 um.

Figure 6C:
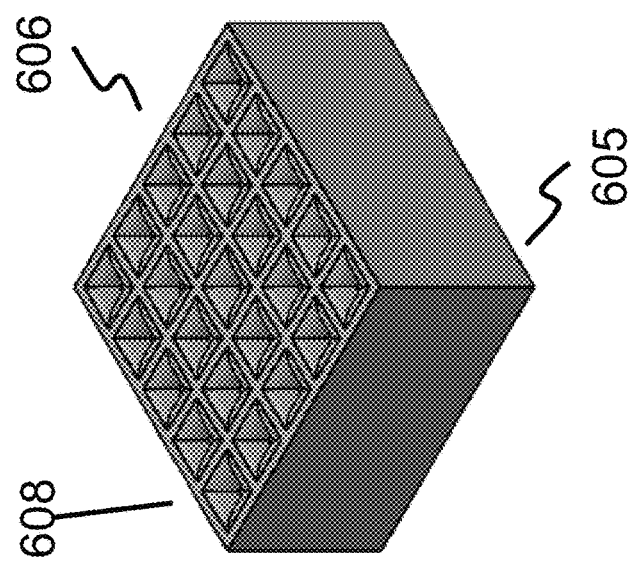
FIG. 6C is an isometric view of a cleaning pad layer with a plurality of evenly spaced and predefined, "negative" inverted curved pyramidal microfeatures with predetermined properties.
Figure 6B:
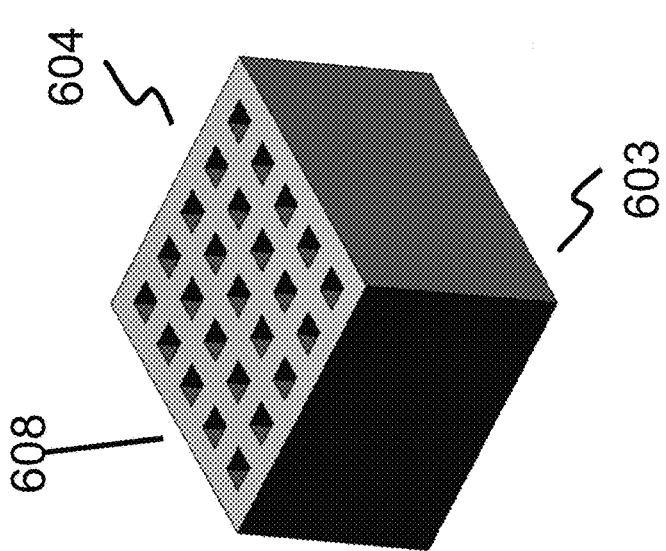
FIG. 6B is an isometric view of a cleaning pad layer with a plurality of evenly spaced and predefined, "negative" micro-columns with predetermined properties.
Figure 6A:
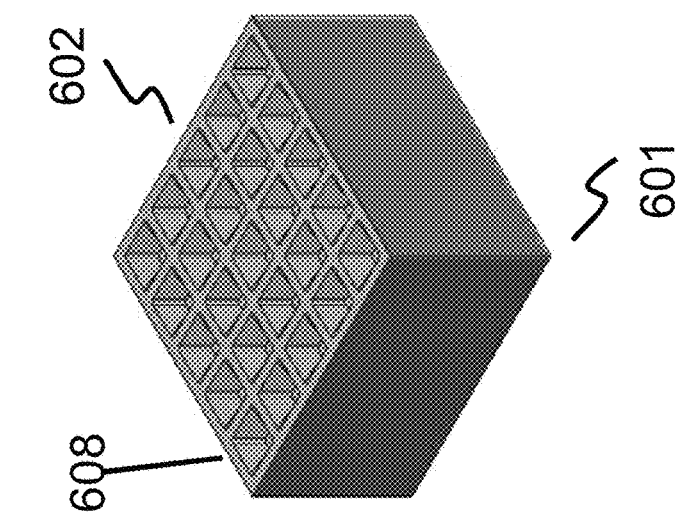
FIG. 6A is an isometric view of a cleaning pad layer with a plurality of evenly spaced and predefined, "negative" micro-pyramids with predetermined properties.
Figure 7:
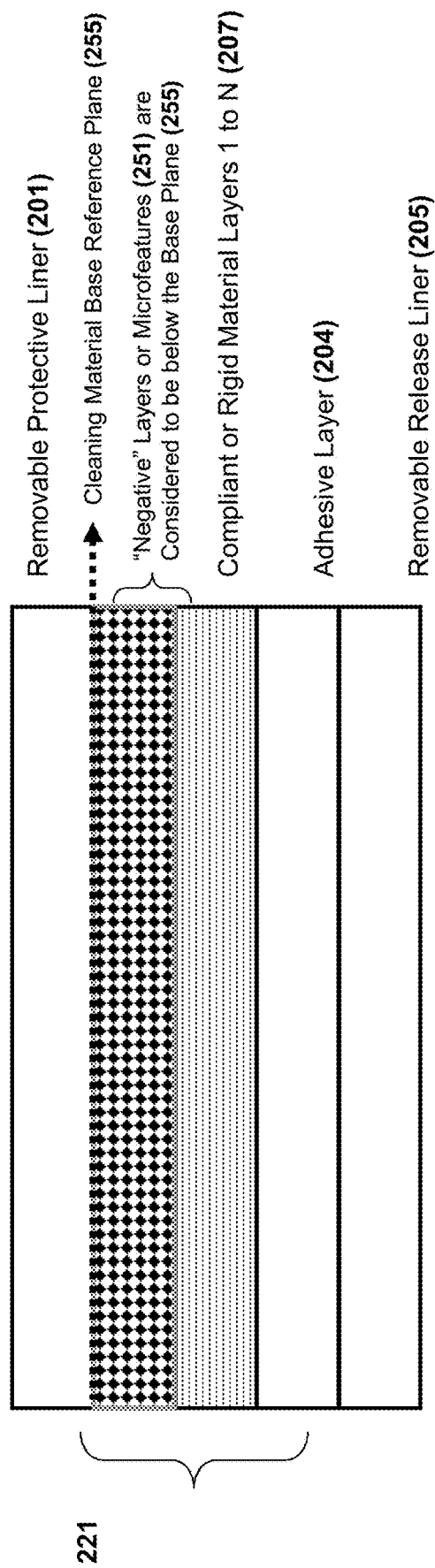
FIG. 7 is a sectional view of a cleaning medium that has one or more intermediate complaint material layers below a cleaning pad layer with a plurality of evenly spaced and predefined, "negative" microfeatures and a removable protective liner.

In an another embodiment of the cleaning medium 221 (shown in FIG. 7), the maximum cleaning efficiency of the cleaning material can be improved using a plurality of "negative" uniformly shaped and regularly spaced, geometric microfeatures, such as a plurality of inverted micro-pyramids 601, a plurality of micro-columns 603, or a plurality of curved inverted micro-pyramids 605, of a pre-determined geometry as shown in FIGS. 6A-6C. In other embodiments, the microfeatures may be variably spaced across the cleaning medium 221. In FIG. 7, the cleaning media 221 is constructed from a single layer of cleaning pad with "negative" microfeatures 251 onto a combination of intermediate compliant or rigid layers 207 with pre-determined predetermined properties.

As an example of one type of functional "negative" microfeature construction, the microfeatures shown in FIGS. 6A, 6B, 6C can be created using a combination of precision fabrication methods such as casting or molding whereby the cleaning pad is built such that the plateau has a dimension of less than 40 um, a height of less than 100 um, and a bottom-to-bottom spacing of less than 250 um. In these examples, each microfeature is recessed into a base reference plane 608. In the example microfeature 601 shown in FIG. 6A, each pyramid microfeature 602 has a 25 um square bottom, with a 40 um height, at a bottom-to-bottom spacing of 100 um. For this construction, the 3D features are attained through a precision fabrication process such that the cleaning pad and microfeatures have a uniform composition. The size and geometry of the "negative" microfeatures may vary according the configuration and material of the contact elements to achieve a pad that will remove the debris but will not damage the probe elements. Generally, the "negative" microfeatures can have several types of geometries including inverted pyramids 602, round or square columns 604 with uniform bottom, or various curved inverted shapes 406 with smaller than 40 um square or round bases, etc. The microfeature type and "negative" geometry may be adjusted during the manufacturing of a cleaning layer such that the material can be used reshape, sharpen or refurbish, the probe element tips and the probe element structure. As an example, the negative microfeatures like those shown in FIG. 6A or FIG. 6C may be used to clean advanced microcantilever contact elements since the physical shape and dimension of those negative microfeatures clean all of the critical surfaces of the microcantilever contact elements.

The dimensions of the "negative" features may have a base-to-top of each microfeature below the base reference plane 608 of 25 um to 500 um, a bottom surface area geometry which can be flat or shaped and that has dimensions ranging in XY dimensions from 20 um up to the XY dimensions of the microfeature opening, sides of the negative feature can be straight or curved, and bottom-to-bottom spacing (the distance between each microfeature) of 50 um to 250 um.

Another embodiment of the cleaning pad/media/device with the functionalized microfeatures is shown in FIGS. 8A-8C that show examples of enlarged sectional views of a cleaning material 800 with "positive" microfeatures layer (with micro-pyramids 802, micro-columns 804, curved micro-pyramids 806) underneath a layer of polymer 10 to 100 um thick with predetermined properties that has been applied across the surface of the "positive" features (801, 803, and 805, respectively). The polymer layer is applied across the top surface and within the spacing between the microfeatures to a predetermined thickness of less than 100 um. The polymer can be tacky and without abrasives or loaded with an abrasive. Typical abrasives that may be incorporated into the polymer may include aluminum oxide, silicon carbide, and diamond although the abrasive particles may also be other well-known abrasive materials with Mohs Hardness of 7 or greater. The amount and size of the abrasive material may vary according the configuration of the microfeatures of the cleaning pad or based on the material and geometry of the contact elements in order to achieve a pad that will remove and collect the debris but will not damage the contact elements or support hardware. As shown in various figures (FIG. 5, FIG. 7 and FIGS. 8A 8C), each cleaning material has a cleaning material base reference plane 255. In the case of positive microfeatures (shown in FIGS. 8A-8C), that base reference plane 255 is at a bottom of the microfeatures nearest the top of the rest of the cleaning material and in the case of negative microfeatures (shown in FIG. 7) the base reference plane 255 is at the base of each negative microfeature nearest the removable protective layer 201.

Figure 8D:
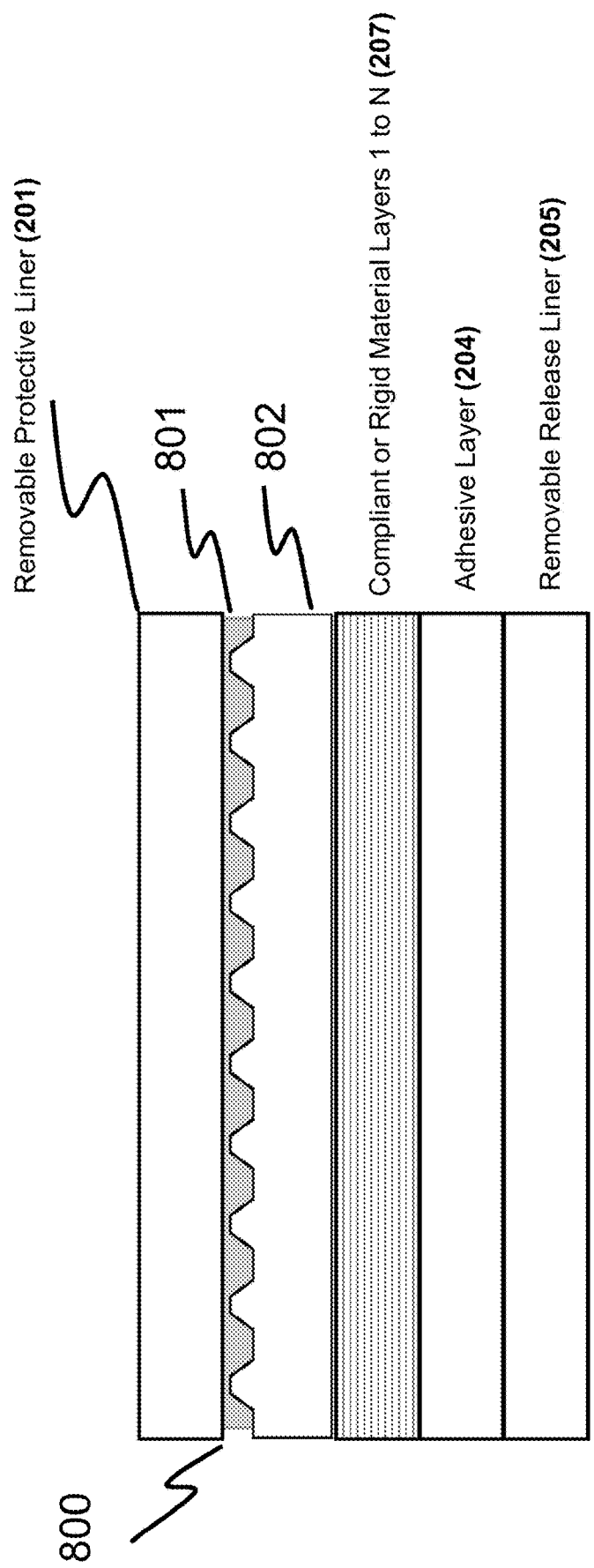
FIG. 8D is a sectional view of a cleaning media layer with predetermined properties such as tack, hardness, abrasiveness, etc., applied to a plurality of evenly spaced and predefined, "positive" [right] micro-pyramids with predetermined properties with one or more intermediate complaint or rigid material layers below a cleaning pad layer of predetermined properties and a protective liner.
Figure 8E:
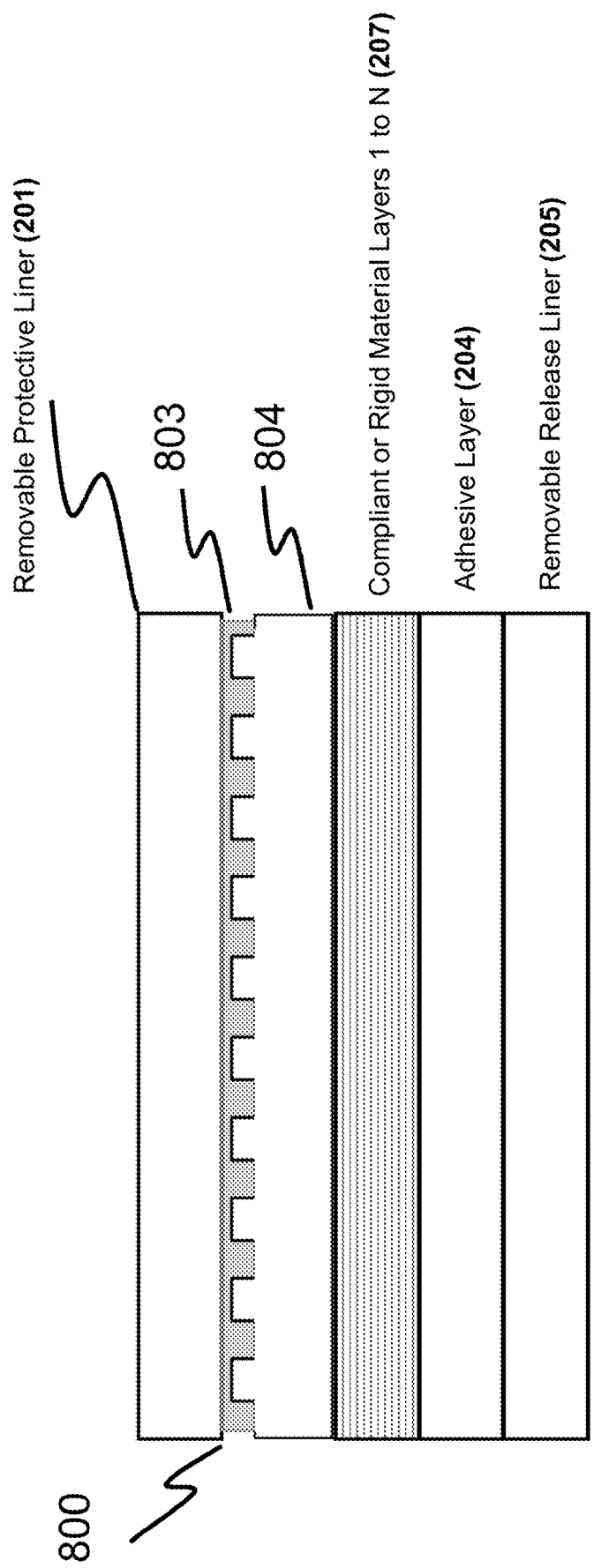
FIG. 8E is a sectional view of a cleaning media layer with predetermined properties such as tack, hardness, abrasiveness, etc., applied to a plurality of evenly spaced and predefined, "positive" micro-columns with predetermined properties with one or more intermediate complaint or rigid material layers below a cleaning pad layer of predetermined properties and a protective liner.
Figure 8F:
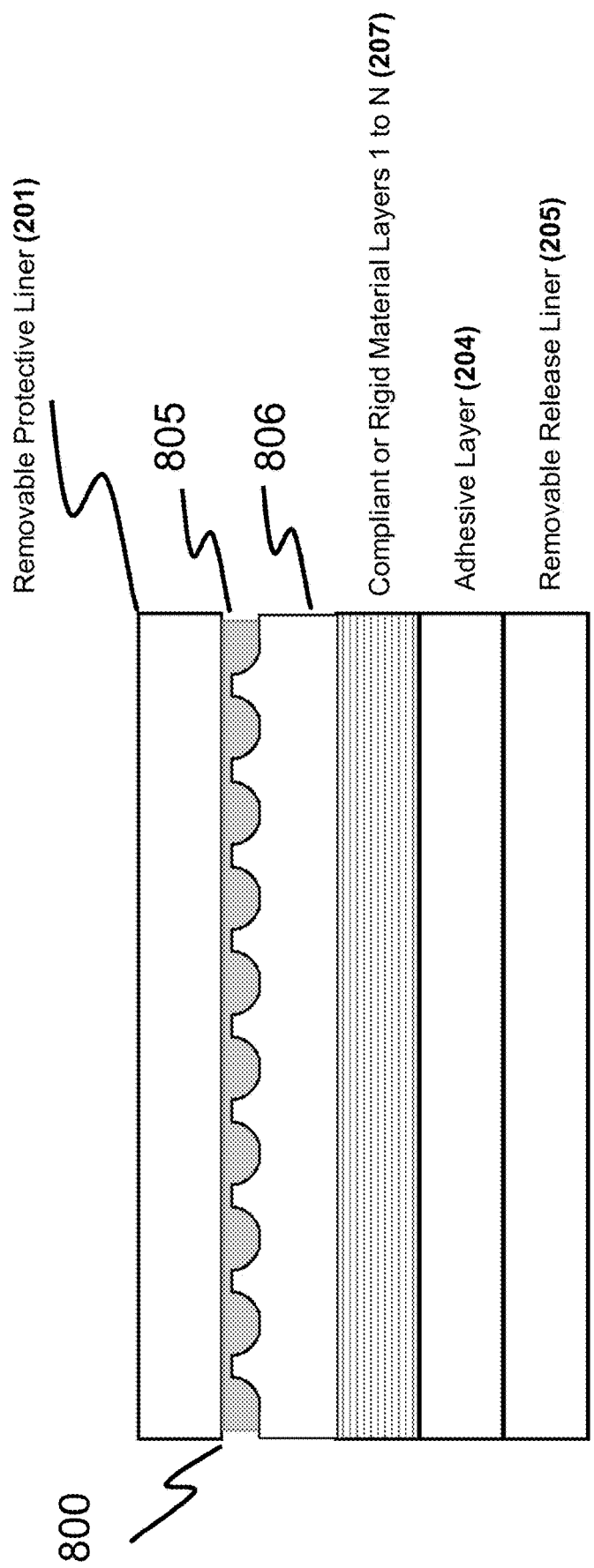
FIG. 8F is a sectional view of a cleaning media layer with predetermined properties such as tack, hardness, abrasiveness, etc., applied to a plurality of evenly spaced and predefined, "positive" curved pyramidal microfeatures with predetermined properties with one or more intermediate complaint or rigid material layers below a cleaning pad layer of predetermined properties and a protective liner.

FIGS. 8D-8F that show examples of enlarged sectional views of a cleaning material 800 with "positive" microfeatures layer (with micro-pyramids 802, micro-columns 804, curved micro-pyramids 806) underneath a layer of polymer 10 to 100 um thick with predetermined properties that has been applied across the surface of the "positive" features (801, 803, and 805, respectively). The microfeatured cleaning pad layer can then be constructed onto a one or more intermediate complaint or rigid material layers below a cleaning pad layer of predetermined properties and a protective liner.

Figure 9D:
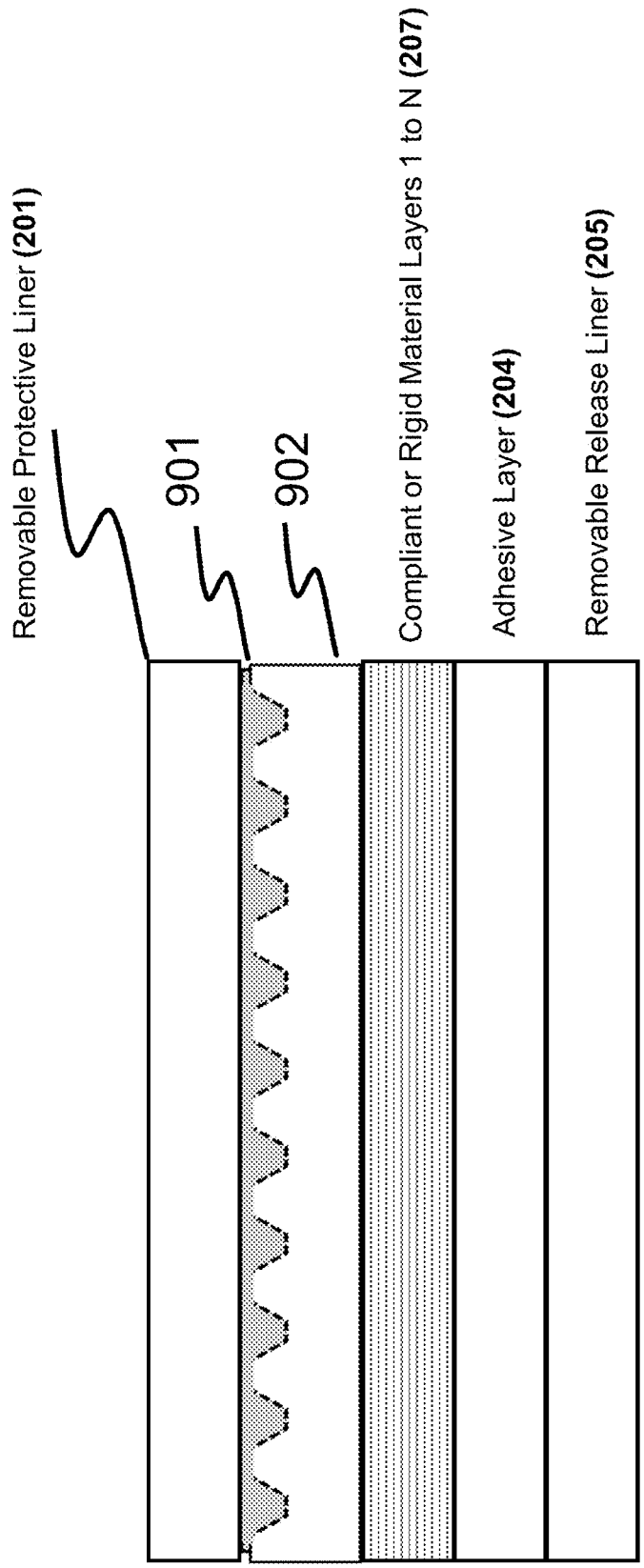
FIG. 9D is a sectional view of a cleaning media layer with predetermined properties such as tack, hardness, abrasiveness, etc., applied to a plurality of evenly spaced and predefined, "negative" micro-pyramids with predetermined properties with one or more intermediate complaint or rigid material layers below a cleaning pad layer of predetermined properties and a protective liner.
Figure 9E:
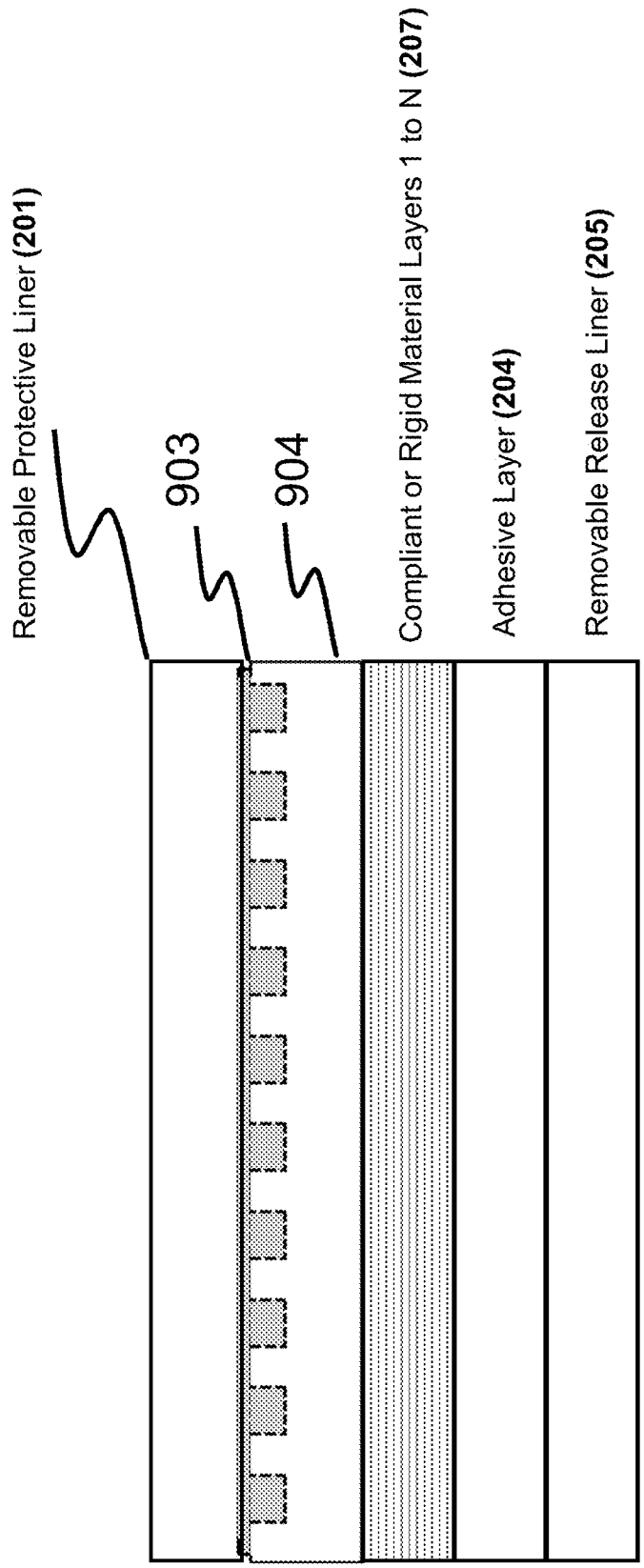
FIG. 9E is a sectional view of a cleaning media layer with predetermined properties such as tack, hardness, abrasiveness, etc., applied to a plurality of evenly spaced and predefined, "negative" micro-columns with predetermined properties with one or more intermediate complaint or rigid material layers below a cleaning pad layer of predetermined properties and a protective liner.
Figure 9F:
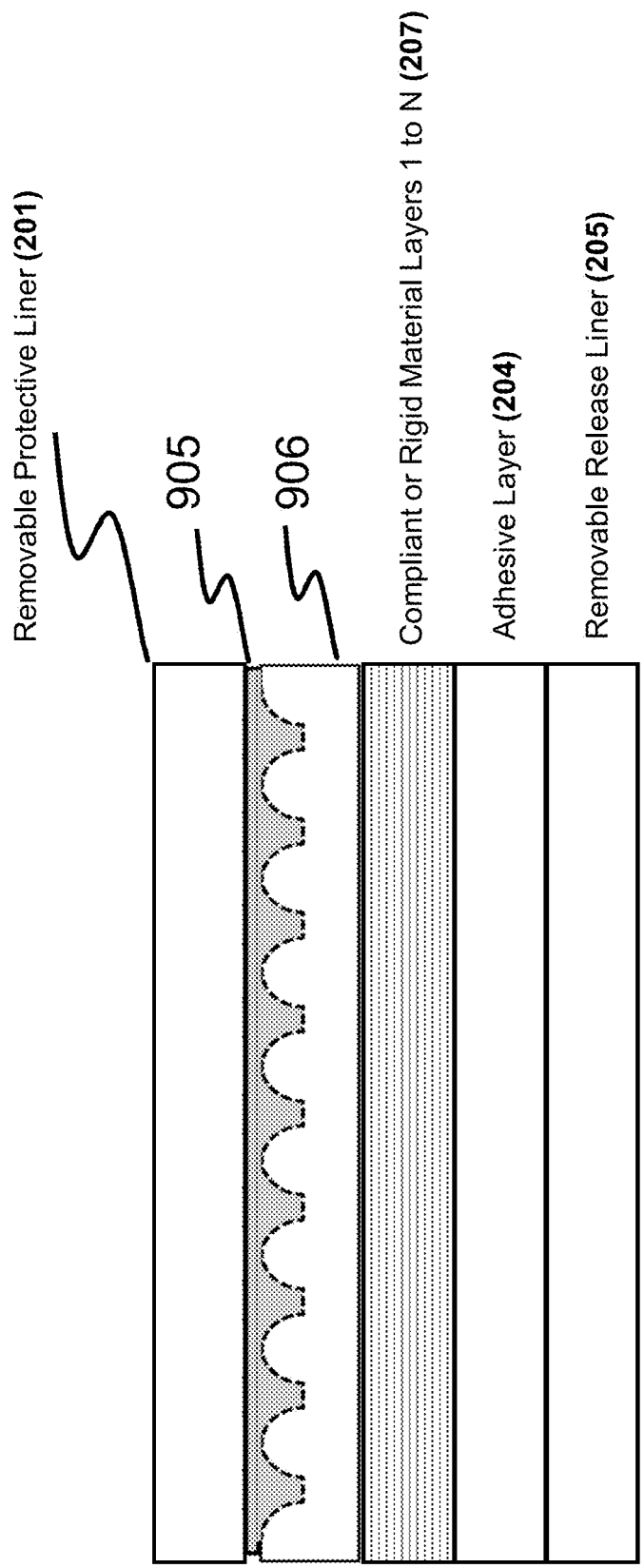
FIG. 9F is a sectional view of a cleaning media layer with predetermined properties such as tack, hardness, abrasiveness, etc., applied to a plurality of evenly spaced and predefined, "negative or inverted" curved pyramid microfeatures with predetermined properties with one or more intermediate complaint or rigid material layers below a cleaning pad layer of predetermined properties and a protective liner.

Another embodiment of the cleaning pad/media/device with the functionalized microfeatures is shown in FIGS. 9A-9C that show examples of enlarged sectional views of a cleaning materials with "negative" microfeatures (inverted micro-pyramids 901, inverted micro-columns 903, curved inverted micro-pyramids 905 with a layer of polymer 10 to 100 um thick with predetermined properties is applied across the surface of the "negative" features (901, 903, and 905, respectively). The polymer layer is applied across the top surface and into the depressions (cavities) of the "negative" microfeatures thus coating an interior surface of each negative microfeature. The polymer can be tacky and without abrasives or loaded with abrasive particles. Typical abrasives that may be incorporated into the polymer may include aluminum oxide, silicon carbide, and diamond although the abrasive particles may also be other well-known abrasive materials with Mohs Hardness of 7 or greater. The amount and size of the abrasive material may vary according the configuration of the microfeatures of the cleaning pad based on the material and geometry of the capillary tubes in order to achieve a pad that will remove and collect the debris but will not damage the capillary tube. The microfeatured cleaning pad layer can then be constructed onto a one or more intermediate complaint or rigid material layers below a cleaning pad layer of predetermined properties and a protective liner. FIGS. 9D-9F show the embodiment of the cleaning media/pad with enlarged section views of the negative microfeatures.

Now, a method for cleaning the capillary tube of a wire bonding machine using the disclosed cleaning devices with functionalized microfeatures will be described with reference to FIG. 10. The insertion of the capillary tube of the wire bonding machine into a cleaning device (in which the surface of the cleaning material is penetrated by an open end of the capillary tube) removes adherent debris from the surfaces of the capillary tube (including the open end, the surfaces inside of the capillary tube and the surfaces on an exterior surface of the capillary tube) without leaving any organic residue that must be subsequently removed with an additional on-line or off-line cleaning process that reduces through-put of the wire bonder machine. The method accomplishes the goal of removing the debris from the capillary tube without removing the capillary tube from the wire bonding machine, thereby increasing the productivity of the wire bonding machine. The cleaning device, that may have the same size and shape as a device being wire bonder or a wafer and may be inserted into a predetermined cleaning tray. Alternatively, the cleaning material with the functionalized microfeatures may be placed into a substrate, such as a wafer, that may be placed into the wafer carriers and thus perform the cleaning. The cleaning material layer of the device has predetermined physical, mechanical, and geometrical properties according the configuration and material of the capillary tube.

As described above, this cleaning step may occur either when the cleaning device is periodically installed from the cleaning tray positioned under the capillary tube or every time from the wafer cassette, or anytime the wire bonder executes a cleaning operation with the cleaning material installed onto a burnishing plate. Use of the cleaning device does not interrupt, in any way, the operation of the wire bonder since the cleaning of the capillary tube is accomplished during the normal operation of the wire bonding machine as shown in FIG. 10. In this manner, the cleaning device is inexpensive and permits the capillary tube to be cleaned without removing the capillary tube from the wire bonder machine.

The methods and apparatus provide one or more advantages including but not limited to maintaining clean capillary tubes. While the disclosure has been described with reference to certain illustrative embodiments, those described herein are not intended to be construed in a limiting sense. For example, variations or combinations of steps in the embodiments shown and described may be used in particular cases without departure from the disclosure. Various modifications and combinations of the illustrative embodiments as well as other advantages and embodiments of the disclosure will be apparent to persons skilled in the arts upon reference to the drawings, description, and claims. It is intended that the scope of the disclosure be defined by the claims appended hereto and their equivalents. While the foregoing has been with reference to a particular embodiment of the invention, it will be appreciated by those skilled in the art that changes in this embodiment may be made without departing from the principles and spirit of the disclosure, the scope of which is defined by the appended claims.

FIG. 10 is a flowchart showing a method 1000 for cleaning wire bonding machines using the various embodiments of the disclosed cleaning material with the functionalized microfeatures. In the method, the wire bonding machine performs its wire bonding operations 1002. The wire bonding machine (that has a control system) or a separate computer system may determine if it is time to clean the wire bonding machine (1004) based on a time interval or the measurement of the characteristics of the wire bonding process. If cleaning is not needed, then the wire bonding continues (1002). If it is determined to be time to clean the capillary tube, a cleaning device having the functionalized microfeatures may be moved into a cleaning position (1006) by various known means and the cleaning is performed using the cleaning material (1008) without taking the wire bonding machine off-line and thus during the normal operating procedure of the wire bonding machine. Once the cleaning is completed (1010), the wire bonding resumes its wire bonding operations (1012).

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

What is claimed is:

1. A method for cleaning a capillary tube of a wire bonding machine, the method comprising:
    performing a wire bonding operation using the capillary tube of the wire bonding machine;
    performing a cleaning operation using a cleaning device that has a cleaning media having a cleaning media base reference plane and a plurality of functionalized microfeatures arranged in an array having a plurality of rows and a plurality of columns of functionalized microfeatures and each functionalized microfeature has a body with a width, a height, a spacing between each body and dimensional properties that optimize the cleaning media so that one or more surfaces of the capillary tube are cleaned without modification or damage, each microfeature extending down from the cleaning media base reference plane and the cleaning media having a plurality of abrasive particles having a Mohs Hardness of 7 or greater uniformly distributed within the body of each functionalized microfeature, a cleaning layer applied across a top surface of the cleaning media having predetermined characteristics that clean contaminants from the one or more surfaces of the capillary tube, the cleaning layer applied on top of all of the functionalized microfeatures from the cleaning media base reference plane down into each negative functionalized microfeature to a bottom of each negative functionalized microfeature and one or more intermediate rigid or compliant underlayers underneath the cleaning media, wherein each underlayer has a modulus of elasticity range between more than 40-MPa to 600-MPa, each layer has a thickness between 25-um and 300-um and each layer has a hardness between 30 Shore A and 90 Shore A; and
    wherein performing the cleaning operation further comprises cleaning, using the functionalized microfeatures, an inner surface of the capillary tube.

2. The method of claim 1, wherein performing a cleaning operation using the cleaning device further comprises using a polymer layer that is 10 to 100 um thick that has a predetermined specific gravity, elasticity, tackiness, planarity, thickness and porosity.

3. The method of claim 1, wherein performing a cleaning operation using the cleaning device further comprises using a plurality of negative microfeature that extends downwards away from the top surface of the cleaning media.

4. The method of claim 1, wherein performing the cleaning operation further comprising performing the cleaning operation of the capillary tube after a predetermined period of time.

5. The method of claim 1, wherein performing the cleaning operation further comprising performing the cleaning operation of the capillary tube without removing the capillary tube from the wire bonding device.

6. The method of claim 5 further comprising resuming the wire bonding operation once the cleaning operation is completed.

* * * * *